US012641764B2

(12) United States Patent
McBain et al.

(10) Patent No.: US 12,641,764 B2
(45) Date of Patent: *May 26, 2026

(54) PATTERNED ELECTROMAGNETIC INTERFERENCE (EMI) MITIGATION MATERIALS INCLUDING CARBON NANOTUBES

(71) Applicant: Laird Technologies, Inc., Chesterfield, MO (US)

(72) Inventors: Douglas S. McBain, Wadsworth, OH (US); Hoang Dinh Do, Canton, MA (US)

(73) Assignee: Laird Technologies, Inc., Chesterfield, MO (US)

( * ) Notice: Subject to any disclaimer, the term of this patent is extended or adjusted under 35 U.S.C. 154(b) by 197 days.

This patent is subject to a terminal disclaimer.

(21) Appl. No.: 18/748,418

(22) Filed: Jun. 20, 2024

(65) Prior Publication Data
US 2024/0357783 A1 Oct. 24, 2024

Related U.S. Application Data

(63) Continuation of application No. 16/844,737, filed on Apr. 9, 2020, now Pat. No. 12,022,642, which is a
(Continued)

(51) Int. Cl.
*H05K 9/00* (2006.01)
*H01Q 17/00* (2006.01)
(52) U.S. Cl.
CPC ........... *H05K 9/009* (2013.01); *H01Q 17/002* (2013.01); *H05K 9/0088* (2013.01)

(58) Field of Classification Search
None
See application file for complete search history.

(56) References Cited

U.S. PATENT DOCUMENTS 5,872,205 A 2/1999 Balke et al.
6,331,265 B1 12/2001 Dupire et al.
(Continued)

FOREIGN PATENT DOCUMENTS

CN 206416588 U 8/2017
DE 102017009572 A1 4/2019
(Continued)

OTHER PUBLICATIONS

Chinese Office Action (and its English machine translation) for CN201980054705.2 that names the same assignee and 3 of the same inventors but is not related through a priority claim; dated Jun. 18, 2024, 19 pages.
(Continued)

*Primary Examiner* — Whitney Moore
(74) *Attorney, Agent, or Firm* — Harness, Dickey & Pierce, P.L.C.; Anthony G. Fussner

(57) ABSTRACT
Disclosed are exemplary embodiments of patterned electromagnetic interference (EMI) mitigation materials (e.g., EMI absorbers, thermally-conductive EMI absorbers, etc.) including carbon nanotubes. The carbon nanotubes may comprise single-walled carbon nanotubes, multi-walled carbon nanotubes, and/or carbon nanostructures comprising a branched network of crosslinked carbon nanotube structures. For example, an EMI mitigation material may comprise a filled dielectric including a pattern of EMI absorbers. The filled dielectric comprises carbon nanotubes.

28 Claims, 18 Drawing Sheets

600

652 — FSS Element
652 — FSS Element
Multilayer Frequency Selective Surface (FSS) Structure 648
652 — FSS Element
646 — Planarization Layer
640 — Pyramidal Structure with Rectangular Base
644
650
650
EMI Absorber

Related U.S. Application Data continuation-in-part of application No. PCT/US2019/065470, filed on Dec. 10, 2019, and a continuation-in-part of application No. PCT/US2019/047273, filed on Aug. 20, 2019.

(60) Provisional application No. 62/777,515, filed on Dec. 10, 2018, provisional application No. 62/720,840, filed on Aug. 21, 2018.

(56) References Cited

U.S. PATENT DOCUMENTS

| | | | |
|---|---|---|---|
| 6,380,294 | B1 | 4/2002 | Babinec et al. |
| 6,437,748 | B1 | 8/2002 | Burnside et al. |
| 6,483,719 | B1 | 11/2002 | Bachman |
| 6,771,204 | B2 | 8/2004 | Hayashi et al. |
| 6,818,231 | B2 | 11/2004 | Alexis |
| 6,884,833 | B2 | 4/2005 | Chheang et al. |
| 7,013,558 | B2 | 3/2006 | Bachman |
| 7,056,455 | B2 | 6/2006 | Matyjaszewski et al. |
| 7,060,241 | B2 | 6/2006 | Glatkowski |
| 7,205,898 | B2 | 4/2007 | Dixon et al. |
| 7,285,591 | B2 | 10/2007 | Winey et al. |
| 7,479,516 | B2 | 1/2009 | Chen et al. |
| 7,506,436 | B2 | 3/2009 | Bachman |
| 7,612,138 | B2 | 11/2009 | Kuznetsov et al. |
| 7,745,528 | B2 | 6/2010 | Prud'Homme et al. |
| 7,825,591 | B2 | 11/2010 | Kimiya et al. |
| 7,830,296 | B2 | 11/2010 | Moore |
| 8,084,532 | B2 | 12/2011 | Fisher et al. |
| 8,344,053 | B2 | 1/2013 | Xu et al. |
| 9,048,009 | B2 | 6/2015 | Xu et al. |
| 9,187,639 | B2 | 11/2015 | Zheng et al. |
| 9,263,802 | B2 | 2/2016 | Hirose |
| 9,505,903 | B2 | 11/2016 | Lee et al. |
| 9,635,789 | B2 | 4/2017 | English et al. |
| 9,704,613 | B2 | 7/2017 | Ghosh et al. |
| 9,949,359 | B2 | 4/2018 | Chen et al. |
| 9,991,604 | B2 | 6/2018 | John et al. |
| 9,999,122 | B2 | 6/2018 | Song et al. |
| 10,017,631 | B2 | 7/2018 | Yun et al. |
| 10,023,715 | B2 | 7/2018 | Hata et al. |
| 10,074,907 | B2 | 9/2018 | Ding et al. |
| 10,477,738 | B2 | 11/2019 | Strader et al. |
| 12,022,642 | B2 | 6/2024 | McBain et al. |
| 2003/0047718 | A1 | 3/2003 | Narayan et al. |
| 2004/0084196 | A1 | 5/2004 | Hogberg et al. |
| 2005/0001780 | A1 | 1/2005 | Aisenbrey |
| 2007/0056769 | A1 | 3/2007 | Severance et al. |
| 2007/0241303 | A1 | 10/2007 | Zhong et al. |
| 2009/0211802 | A1 | 8/2009 | Poulsen |
| 2010/0096181 | A1 | 4/2010 | Nakamura et al. |
| 2010/0308279 | A1 | 12/2010 | Zhou et al. |
| 2011/0214284 | A1 | 9/2011 | Xu et al. |
| 2012/0142832 | A1 | 6/2012 | Varma et al. |
| 2013/0075632 | A1 | 3/2013 | Cho et al. |
| 2014/0182923 | A1 | 7/2014 | Gerken et al. |
| 2014/0264182 | A1 | 9/2014 | Suorsa |
| 2015/0069290 | A1 | 3/2015 | Guo et al. |
| 2016/0100511 | A1 | 4/2016 | Kurz et al. |
| 2016/0309628 | A1 | 10/2016 | Ghosh |
| 2016/0376487 | A1 | 12/2016 | Abramson et al. |
| 2017/0037261 | A1 | 2/2017 | Fang et al. |
| 2017/0226303 | A1 | 8/2017 | Feng et al. |
| 2017/0352948 | A1 | 12/2017 | Urcia et al. |
| 2018/0049311 | A1 | 2/2018 | Hoang et al. |
| 2018/0153031 | A1 | 5/2018 | Strader et al. |
| 2018/0159207 | A1 | 6/2018 | Shurish et al. |
| 2018/0177081 | A1 | 6/2018 | Ghosh |
| 2018/0351274 | A1 | 12/2018 | Callewaert |
| 2018/0370197 | A1 | 12/2018 | Nagamune et al. |
| 2018/0375215 | A1 | 12/2018 | Nagamune et al. |
| 2018/0376628 | A1 | 12/2018 | Ghosh et al. |
| 2019/0159371 | A1 | 5/2019 | Grinsteinner |
| 2019/0387648 | A1 | 12/2019 | Nagamune |

FOREIGN PATENT DOCUMENTS

| | | | | |
|---|---|---|---|---|
| DE | 202020004748 | U1 | 12/2020 | |
| EP | 0711001 | A2 | 5/1996 | |
| EP | 1623437 | A1 | 2/2006 | |
| JP | 03-069197 | | 3/1991 | |
| JP | 2000-353893 | A | 12/2000 | |
| JP | 2002-261489 | A | 9/2002 | |
| JP | 2003241761 | A | 8/2003 | |
| JP | 2003318589 | A | 11/2003 | |
| JP | 2004-172200 | A | 6/2004 | |
| JP | 2004-359752 | A | 12/2004 | |
| JP | 2007251639 | A | 9/2007 | |
| JP | 2008135485 | A | 6/2008 | |
| JP | 2010-190612 | A | 9/2010 | |
| JP | 2012199272 | A | 10/2012 | |
| JP | 5167341 | B2 | 3/2013 | |
| JP | 2017171773 | A | 9/2017 | |
| JP | 2017-183677 | A | 10/2017 | |
| JP | 6546717 | B2 | 7/2019 | |
| KR | 10-2008-0030064 | A | 4/2008 | |
| KR | 10-2010-0018098 | A | 2/2010 | |
| KR | 10-2016-0130985 | A | 11/2016 | |
| KR | 102012415 | B1 | 8/2019 | |
| KR | 10-2019-0118386 | A | 10/2019 | |
| WO | WO-2017044381 | A1 | 3/2017 | |
| WO | WO-2017062173 | A1 | 4/2017 | |
| WO | WO-2020041320 | A1 * | 2/2020 | ............ H10W 42/20 |

OTHER PUBLICATIONS

International Search Report and Written Opinion for PCT Application No. PCT/US2019/065470 which is the parent application to the instant application, dated Apr. 10, 2020, 15 pages.

International Search Report and Written Opinion for PCT application No. PCT/US2019/047273 which is the parent application to the instant application, dated Dec. 2, 2019, 13 pages.

Dixon, Paul; Theory and Application of RF/Microwave Absorbers; eccosorb.com; accessed Aug. 31, 2018, 19 pages.

Huq, et al.; Polymer; Vertical orientation of solvent cast nanofilled PS-b-PEO block copolymer thin films at high nanoparticle loading; Aug. 11, 2015, pp. 22-31.

Dixon, Paul; Dampening Cavity Resonance Using Absorber Material; www.rfdesign.com, May 2004, 3 pages.

Atencia et al, Using Pattern Homogenization of binary grayscale masks to fabricate microfluidic structures with 3D topography, http://pubs.rsc.org/en/content/articlelanding/2007/lcb709369a; Aug. 31, 2007, 7 pages.

HI MAG™ series Cavity Resonance Absorber, www.modusadvanced.com; Copyright 2016, Modus Advanced, Inc., 1 page.

Cabral JT, Frontal Photopolymerization for microfluidic applications, https://www.ncbi.nlm.nih.gov/pubmed/15518489; Nov. 9, 2004; 2 pages.

Hamdi, et al., Scanning-Beam Antenna on Metamaterials Coplanar Structure for Wireless Applications; Journal of Digital Information Management; vol. 9 No. 3, Jun. 11, 6 pages.

Ding, et al.; Ultra-broadband Microwave Metamaterial Absorber; accessed Aug. 15, 2018, 15 pages.

Watts, et al., Metamaterial Electromagnetic Wave Absorbers, www.materialsviews.com, Adv. Mater. 2012, 24, OP98-OP120, Copyright 2012, 23 pages.

Wang, J. F., et al., Three-Dimensional Metamaterial Microwave Aborbers Composed of Coplanat Magnetic and Electric Resonators, Progress In Electromagnetics Research Letters, vol. 7, 15-24, 2009; 10 pages.

Tehrani, Bijan K., et al., Inkjet and 3d Printing Technology for Fundamental Millimeter-Wave Wireless Packaging, dated Jul. 2018, 5 pages.

Trantina, Eric; For design engineers, the future is multifunctional; https://www.linkedin.com/pulse/design-engineers-future-multifunctional-eric-trantina/?trackingid=%2BYGAi4YoQ5C%2FL3k1nLljkw%3D%3D; Mar. 6, 2020, 4 pages.

Athlos™ Carbon Nanostructures (CNS), cabotcorp.com; 2019; 2 pages.

(56)            References Cited

OTHER PUBLICATIONS

Athlos™ Carbon Nanostructures; cabotcorp.com; Aug. 2019, 3 pages.

Thiol-ene reaction; https://en.wikipedia.org/wiki/Thiol-ene_reaction; Jun. 2, 2018; 6 pages.

Office Action for South Korea Application No. 20-2020-0004421 that names the same inventors and assignee but is not related through a priority claim; dated Jan. 11, 2011; 7 pages.

International Search Report and Written Opinion for PCT Application No. PCT/US2021/021823 that names the same inventors and assignee but is ot related through a priority claim; Jul. 1, 2021; 10 pages.

Supplementary European Search Report for EP19852650.1 that claims priority to the same parent application as the instant application; dated Sep. 21, 2021; 4 pages.

European Office Action for EP19852650.1 that claims priority to the same parent application as the instant application; dated ; Oct. 10, 2021; 9 pages.

Japanese Office Action and its English translation for JP2021-509837 which claims priority to the same parent application as the instant application; Jun. 7, 2022; 17 pages.

Japanese Decision of Rejection for JP2021-509837 which claims priority to the same parent application as the instant application; Jan. 24, 2023; 11 pages.

Korean Office Action for KR10-2021-7007608 that claims priority to the same parent application as the instant application; dated Jan. 26, 2023, 10 pages.

European Office Action for Application No. EP21783744.2 dated Feb. 19, 2024, 12 Pages.

European Search Report for EP24158538 that claims priority to the same parent application as the instant application; dated May 31, 2024; 11 pages.

Summons to attend oral proceedings dated Mar. 31, 2023 for European U.S. Appl. No. 19/852,650 which claims priority to the same parent application as the instant application, 15 pages.

* cited by examiner

200

201 Computer Design to Model Part 202 3D Print Modeled Part to Create Master

203 Replicate (PDMS) Mold then Surface Treat 204 (PDMS + Carbon Black) Parts 8000.0
40000.0

205 Testing

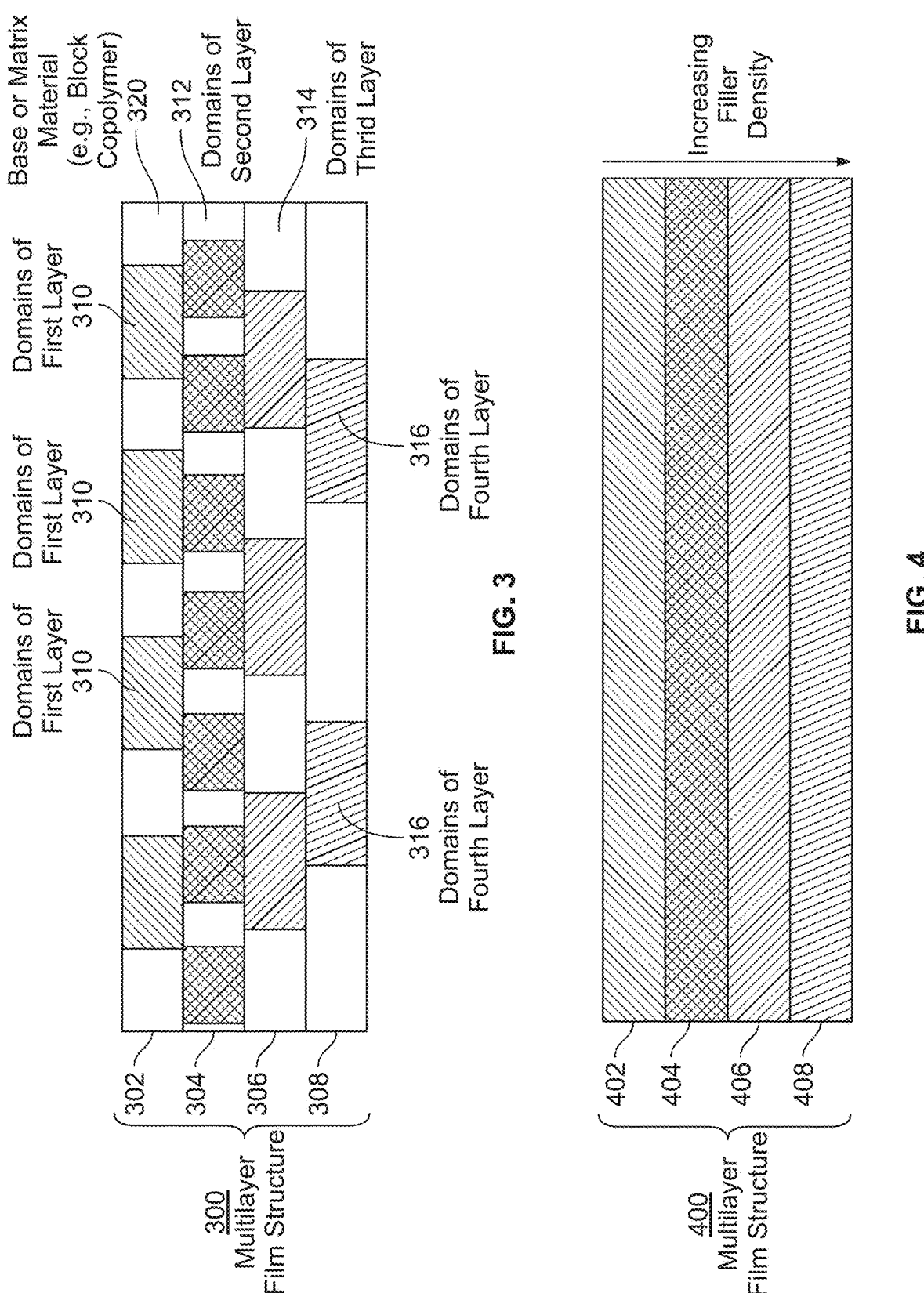

600

652 FSS Element

652 FSS Element

Multilayer Frequency Selective Surface (FSS) Structure 648

652 FSS Element

646 Planarization Layer

640 Pyramidal Structure with Rectangular Base

644 EMI Absorber

650

650

Pyramidal Structure with Rectangular Base for Mitigating High Frequency EMI 740 740

Metal BLS for Mitigating Low Frequency EMI

754

700

Pyramidal Structure with Rectangular Base 840 840

Metal BLS

854

800

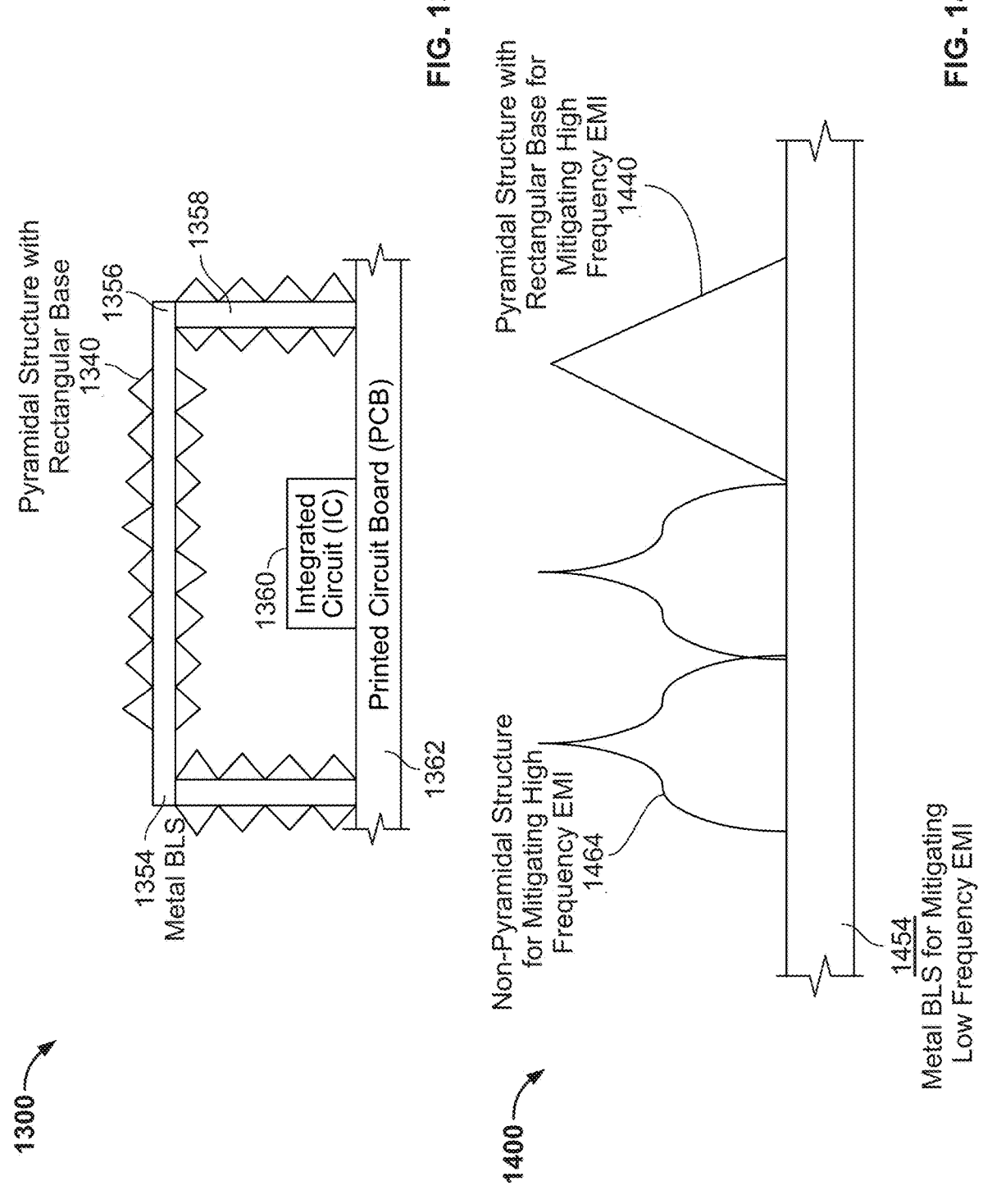

2100

2100

2200

PATTERNED ELECTROMAGNETIC INTERFERENCE (EMI) MITIGATION MATERIALS INCLUDING CARBON NANOTUBES

CROSS-REFERENCE TO RELATED APPLICATIONS

This application is a continuation of U.S. patent application Ser. No. 16/844,737 filed Apr. 9, 2020, which published as US2020/0253096 on Aug. 6, 2020 and is issuing as U.S. Pat. No. 12,022,642 on Jun. 25, 2024.

U.S. patent application Ser. No. 16/844,737 is a continuation-in-part of PCT International Patent Application No. PCT/US2019/047273 filed Aug. 20, 2019 (published as WO2020/041320 on Feb. 27, 2020), which, in turn, claims priority to and the benefit of U.S. Provisional Patent Application No. 62/720,840 filed Aug. 21, 2018.

U.S. patent application Ser. No. 16/844,737 is also a continuation-in-part of PCT International Patent Application No. PCT/US2019/065470 filed Dec. 10, 2019 (published as WO2020/123500 on Jun. 18, 2020), which, in turn, claims priority to and the benefit of U.S. Provisional Patent Application No. 62/777,515 filed Dec. 10, 2018.

The entire disclosures of the above applications are incorporated herein by reference.

FIELD

The present disclosure relates to patterned electromagnetic interference (EMI) mitigation materials (e.g., EMI absorbers, etc.) including carbon nanotubes (e.g., single-walled carbon nanotubes, multi-walled carbon nanotubes, and/or carbon nanostructures, etc.).

BACKGROUND

This section provides background information related to the present disclosure which is not necessarily prior art.

Electrical components, such as semiconductors, integrated circuit packages, transistors, etc., typically have pre-designed temperatures at which the electrical components optimally operate. Ideally, the pre-designed temperatures approximate the temperature of the surrounding air. But the operation of electrical components generates heat. If the heat is not removed, the electrical components may then operate at temperatures significantly higher than their normal or desirable operating temperature. Such excessive temperatures may adversely affect the operating characteristics of the electrical components and the operation of the associated device.

To avoid or at least reduce the adverse operating characteristics from the heat generation, the heat should be removed, for example, by conducting the heat from the operating electrical component to a heat sink. The heat sink may then be cooled by conventional convection and/or radiation techniques. During conduction, the heat may pass from the operating electrical component to the heat sink either by direct surface contact between the electrical component and heat sink and/or by contact of the electrical component and heat sink surfaces through an intermediate medium or thermal interface material (TIM). The thermal interface material may be used to fill the gap between thermal transfer surfaces, in order to increase thermal transfer efficiency as compared to having the gap filled with air, which is a relatively poor thermal conductor.

In addition, a common problem in the operation of electronic devices is the generation of electromagnetic radiation within the electronic circuitry of the equipment. Such radiation may result in electromagnetic interference (EMI) or radio frequency interference (RFI), which can interfere with the operation of other electronic devices within a certain proximity. Without adequate shielding, EMI/RFI interference may cause degradation or complete loss of important signals, thereby rendering the electronic equipment inefficient or inoperable.

A common solution to ameliorate the effects of EMI/RFI is through the use of shields capable of absorbing and/or reflecting and/or redirecting EMI energy. These shields are typically employed to localize EMI/RFI within its source, and to insulate other devices proximal to the EMI/RFI source.

The term "EMI" as used herein should be considered to generally include and refer to EMI emissions and RFI emissions, and the term "electromagnetic" should be considered to generally include and refer to electromagnetic and radio frequency from external sources and internal sources. Accordingly, the term shielding (as used herein) broadly includes and refers to mitigating (or limiting) EMI and/or RFI, such as by absorbing, reflecting, blocking, and/or redirecting the energy or some combination thereof so that it no longer interferes, for example, for government compliance and/or for internal functionality of the electronic component system.

DRAWINGS

The drawings described herein are for illustrative purposes only of selected embodiments and not all possible implementations, and is not intended to limit the scope of the present disclosure.

FIGS. 1A-1E illustrate an exemplary pyramidal pattern for a material according to an exemplary embodiment.

FIGS. 2A-2E respectively illustrate steps of an exemplary process relating to fabrication of patterns in filled dielectric systems according to exemplary embodiments.

FIG. 3 illustrates a multilayer film structure including block copolymer films with through-thickness domains according to an exemplary embodiment.

FIG. 4 illustrates a multilayer film structure according to an exemplary embodiment in which filler density per layer increases in a direction from the top layer to the bottom layer.

FIG. 13 illustrates a BLS and pyramidal structures along the BLS top and sidewalls according to an exemplary embodiment in which pyramidal structures are along both the outer and inner (or exterior and interior) surfaces of the BLS top and sidewalls that protrude outwardly and inwardly, respectively, in opposite directions generally towards and generally away from the PCB component.

FIG. 14 illustrates both non-pyramidal structures and pyramidal structures along a portion of a BLS according to an exemplary embodiment.

Corresponding reference numerals may indicate corresponding (but not necessarily identical) parts throughout the several views of the drawings.

DETAILED DESCRIPTION

Figures 1A, 1B, 1C, 1D, 1E:
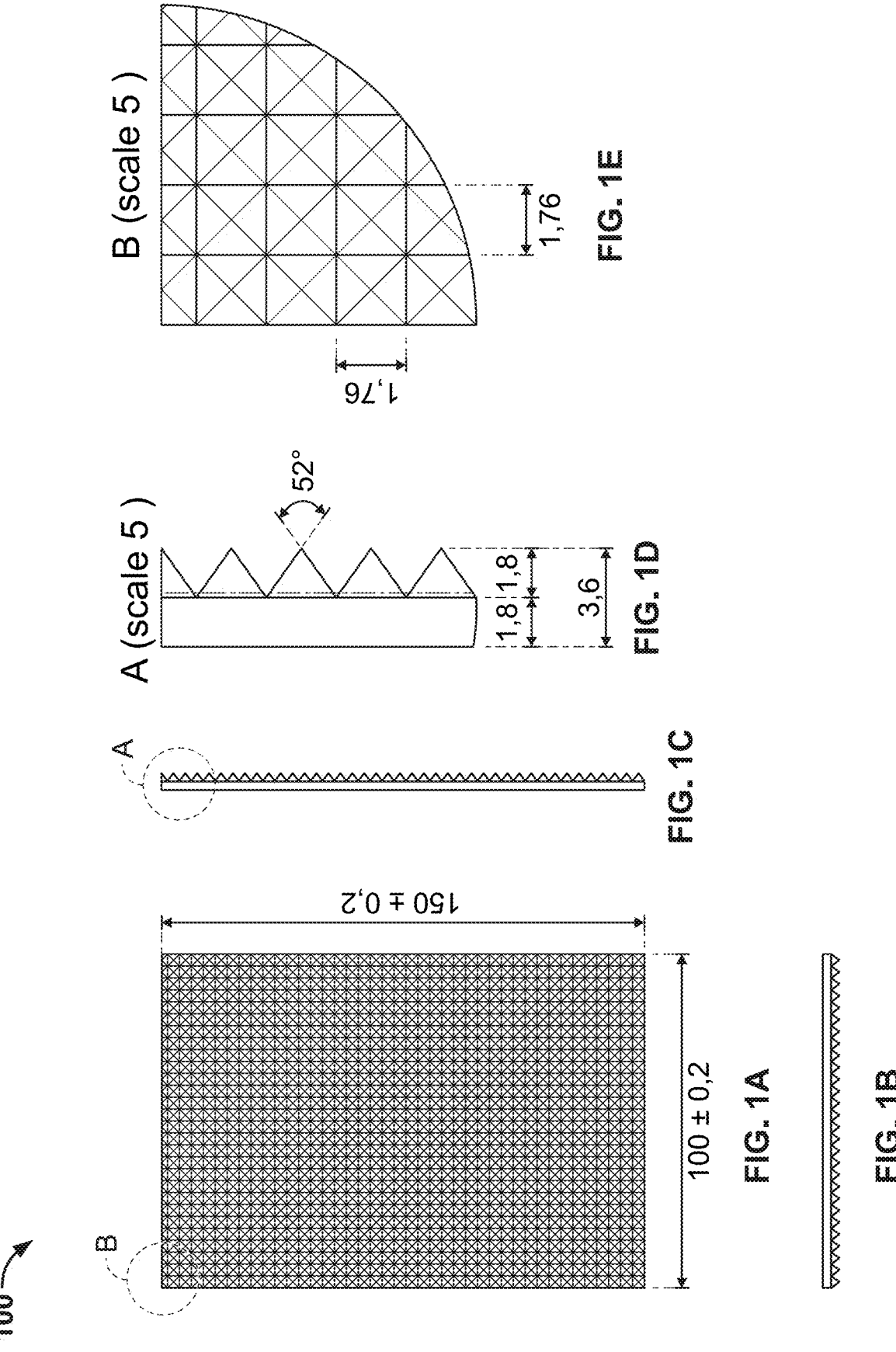

Example embodiments will now be described more fully with reference to the accompanying drawings.

Disclosed are exemplary embodiments of patterned electromagnetic interference (EMI) mitigation materials (e.g., EMI absorbers, thermally-conductive EMI absorbers, etc.) including carbon nanotubes. The carbon nanotubes may comprise single-walled carbon nanotubes, multi-walled carbon nanotubes, and/or carbon nanostructures comprising a branched network of crosslinked carbon nanotube structures. For example, exemplary embodiments may include broadband millimeter wave EMI absorbers comprising carbon nanotubes.

In exemplary embodiments, an EMI mitigation material comprises a filled dielectric including a pattern of EMI absorbers, e.g., a pattern of EMI absorbing structures protruding outwardly along at least one side of the filled dielectric, etc. The filled dielectric comprises carbon nanotubes. The carbon nanotubes comprise one or more of single-walled carbon nanotubes, multi-walled carbon nanotubes, and/or carbon nanostructures comprising a branched network of crosslinked carbon nanotube structures.

The filled dielectric may comprise an injection moldable and/or polymer resin. And the carbon nanotubes may comprise one or more of single-walled carbon nanotubes within the injection moldable and/or polymer resin, multi-walled carbon nanotubes within the injection moldable and/or polymer resin, and/or carbon nanostructures comprising a branched network of crosslinked carbon nanotube structures within the injection moldable and/or polymer resin.

The EMI mitigation material may be configured to be operable with greater than 15 decibels of reflection loss at frequencies from about 40 gigahertz (GHz) to about 120 GHz. For example, the EMI mitigation material may be configured to be operable with greater than 15 decibels of reflection loss at frequencies from about 60 GHz to about 90 GHz. Or, for example, the EMI mitigation material may be configured to be operable with greater than 15 decibels of reflection loss at frequencies from about 70 GHz to about 85 GHz.

The pattern of EMI absorbers may comprise a pattern of pyramidal structures, a pattern of non-pyramidal structures, a pattern including a combination of pyramidal structures and non-pyramidal structures, and/or a pattern of structures including at least two structures having different heights that are predetermined or randomized. In exemplary embodiments, the pattern of EMI absorbers comprise rectangular pyramids including rectangular bases configured such that the rectangular bases of adjacent rectangular pyramids contact each other substantially without any gaps or spaced distances between the rectangular bases of the adjacent rectangular pyramids.

The filled dielectric may comprise a multilayer film structure defined by a plurality of layers having different filler densities and/or concentrations that define the pattern of EMI absorbers.

The filled dielectric may comprise a multilayer film structure defined by a plurality of layers including fillers dispersed within the layers to define through-thickness domains and/or segregated discrete areas within the layers that that define the pattern of EMI absorbers.

The EMI mitigation material may be configured to be multifunctional having a first functionality of EMI mitigation and a second functionality of thermal management. For example, the EMI mitigation material may be configured to be operable with greater than 15 decibels of reflection loss at frequencies from about 40 gigahertz (GHz) to about 120 GHz and have a high thermal conductivity (e.g., within a range from about 1 W/mK (watts per meter per Kelvin) to about 10 W/mK, etc.). These thermal conductivities are only examples as other embodiments may have a thermal conductivity higher than 10 W/mK, less than 1 W/mK, or between 1 and 10 W/mk.

An EMI absorbing sheet may comprise and/or be made from the EMI mitigation material. In which case, the pattern of EMI absorbers may comprise EMI absorbing structures protruding outwardly along at least one side of the EMI absorbing sheet. For example, the EMI absorbing structures may be formed by a casting process, an injection molding process, a rolling/forming process, or a deposition process. The EMI absorbing sheet may further include fabric along at least one side of (e.g., a bottom side, etc.) the EMI absorbing sheet opposite the at least one side (e.g., top side, etc.) along which the EMI absorbing structures outwardly protrude. The fabric may comprise one or more of a flame-resistant meta-aramid material (e.g., NOMEX flame-resistant meta-aramid material, etc.) and/or an open weave polymeric fabric (e.g., DACRON open weave polymeric fabric, etc.), etc. The fabric may comprise a fabric layer along the at least one side of the EMI absorbing sheet that is opposite the at least one side along which the EMI absorbing structures outwardly protrude. The fabric may be configured to provide reinforcement and mechanical strength to the EMI absorbing sheet, e.g., to thereby inhibit tearing of the EMI absorbing sheet, etc.

An EMI absorbing radar bracket (e.g., an automotive radar bracket, a non-automotive or other radar bracket, etc.) may comprise and/or be made from the EMI mitigation material. The EMI absorbing radar bracket is configured to be positionable relative to a radar device whereat reflection loss modifies radiation surrounding the radar device. The pattern of EMI absorbers may be formed by a casting process, an injection molding process, a rolling/forming process, or a deposition process.

In exemplary embodiments, an EMI absorber comprises EMI absorbing structures including carbon nanotubes. The EMI absorbing structures are configured to suppress or reduce a probability of reflection of incident radiation through an aperture into a cavity or chamber when the EMI absorbing structures are disposed along an exterior to and/or an outside of the cavity or chamber. The carbon nanotubes comprise one or more of single-walled carbon nanotubes, multi-walled carbon nanotubes, and/or carbon nanostructures comprising a branched network of crosslinked carbon nanotube structures.

The EMI absorbing structures may comprise an injection moldable and/or polymer resin. And the carbon nanotubes may comprise one or more of single-walled carbon nanotubes within the injection moldable and/or polymer resin, multi-walled carbon nanotubes within the injection moldable and/or polymer resin, and/or carbon nanostructures comprising a branched network of crosslinked carbon nanotube structures within the injection moldable and/or polymer resin.

The EMI absorbing structures may be configured to suppress or reduce the probability of reflection of high frequency radiation at wide angles and/or radiation at stray frequencies through a radar aperture into a cavity or chamber, whereby the EMI absorber placement may thereby allow for improved performance of electronics inside the cavity or chamber and remove stray frequencies.

The EMI absorbing structures may comprise rectangular pyramids including rectangular bases configured such that the rectangular bases of adjacent rectangular pyramids contact each other substantially without any gaps or spaced distances between the rectangular bases of the adjacent rectangular pyramids.

The EMI absorber may be configured to be operable with greater than 15 decibels of reflection loss at frequencies from about 40 gigahertz (GHz) to about 120 GHz. For example, the EMI absorber may be configured to be operable with greater than 15 decibels of reflection loss at frequencies from about 60 GHz to about 90 GHz. Or, for example, the EMI absorber may be configured to be operable with greater than 15 decibels of reflection loss at frequencies from about 70 GHz to about 85 GHz.

The EMI absorber may comprise a multilayer film structure defined by a plurality of layers having different filler densities and/or concentrations that define the EMI absorbing structures.

The EMI absorber may comprise a multilayer film defined by a plurality of layers including fillers dispersed within the layers to define through-thickness domains and/or segregated discrete areas within the layers that define the EMI absorbing structures.

The EMI absorber may be configured to be multifunctional having a first functionality of EMI mitigation and a second functionality of thermal management. For example, the EMI absorber may be configured to be operable with greater than 15 decibels of reflection loss at frequencies from about 40 gigahertz (GHz) to about 120 GHz and have a high thermal conductivity (e.g., within a range from about 1 W/mK (watts per meter per Kelvin) to about 10 W/mK, etc.). These thermal conductivities are only examples as other embodiments may have a thermal conductivity higher than 10 W/mK, less than 1 W/mK, or between 1 and 10 W/mk.

A device component may comprise the EMI absorber. The EMI absorbing structures may be disposed along and protrude outwardly from one or more exterior portions of the device component and configured for EMI mitigation and/or absorbing high frequency EMI. The device component may define a chamber and an aperture into the chamber. The EMI absorbing structures may be disposed along one or more inner surfaces of the device component within the chamber.

In exemplary embodiments, a method of making an electromagnetic interference (EMI) mitigation material comprises forming a pattern of EMI absorbers along and/or within a filled dielectric comprising carbon nanotubes. The carbon nanotubes comprise one or more of single-walled carbon nanotubes, multi-walled carbon nanotubes, and/or carbon nanostructures comprising a branched network of crosslinked carbon nanotube structures.

The filled dielectric may comprise an injection moldable and/or polymer resin. And the carbon nanotubes may comprise one or more of single-walled carbon nanotubes within the injection moldable and/or polymer resin, multi-walled carbon nanotubes within the injection moldable and/or polymer resin, and/or carbon nanostructures comprising a branched network of crosslinked carbon nanotube structures within the injection moldable and/or polymer resin.

The EMI absorbers may comprise rectangular pyramids including rectangular bases configured such that the rectangular bases of adjacent rectangular pyramids contact each other substantially without any gaps or spaced distances between the rectangular bases of the adjacent rectangular pyramids.

The method may include forming the pattern of EMI absorbers by a casting process, an injection molding process, a rolling/forming process, or a deposition process.

The EMI mitigation material may be configured to be operable with greater than 15 decibels of reflection loss at frequencies from about 40 gigahertz (GHz) to about 120 GHz. For example, the EMI mitigation material may be configured to be operable with greater than 15 decibels of reflection loss at frequencies from about 60 GHz to about 90 GHz. Or, for example, the EMI mitigation material may be configured to be operable with greater than 15 decibels of reflection loss at frequencies from about 70 GHz to about 85 GHz.

Forming the pattern of EMI absorbers may comprise dispersing fillers within layers of a multilayer film structure at different filler densities and/or concentrations and/or to define through-thickness domains and/or segregated discrete areas within the layers that define the EMI absorbing structures.

Forming the pattern of EMI absorbers may comprise forming EMI absorbing structures that protrude outwardly along at least one side of an EMI absorbing sheet. The method may further include providing fabric along at least one side of the EMI absorbing sheet opposite the at least one side along which the EMI absorbing structures outwardly protrude. The fabric may comprise one or more of a flame-resistant meta-aramid material (e.g., NOMEX flame-resistant meta-aramid material, etc.) and/or an open weave polymeric fabric (e.g., DACRON open weave polymeric fabric, etc.), etc. The fabric may comprise a fabric layer along the at least one side of the EMI absorbing sheet that is opposite the at least one side along which the EMI absorbing structures outwardly protrude. The fabric may be configured to provide reinforcement and mechanical strength to the EMI absorbing sheet, e.g., to thereby inhibit tearing of the EMI absorbing sheet, etc.

Also disclosed herein are exemplary embodiments of films (e.g., multilayer block copolymer films, homogeneous block copolymer films, single layer block copolymer films, etc.) and patterned materials (e.g., roll to roll patternable polymer, etc.), which may have controlled and/or tailored performance (e.g., thermal management, electromagnetic interference (EMI) mitigation, electrical conductivity, thermal conductivity, EMI absorbing, magnetic, dielectric, and/or structural performance, etc.). Also disclosed are exemplary embodiments of systems and methods for making such multilayer films, patterned materials, and single layer/homogeneous films. Exemplary embodiments are also disclosed of thermal management and/or EMI mitigation materials, board level shields, and devices. For example, an electronic device (e.g., smartphone, smartwatch, 5G antenna in package (AIP), etc.) may include one or more of a multilayer film, patterned material, single layer/homogeneous film, board level shield, and/or thermal management and/or EMI mitigation material as disclosed herein.

In exemplary embodiments, a material includes a pattern of structures (e.g., pattern of pyramidal structures, hierarchical pattern, pattern of non-pyramidal structures, pattern of bell-shaped structures, combinations thereof, etc.). The material may comprise filled dielectric, such as polydimethylsiloxane (a) filled with carbon black and/or carbon nanotubes (e.g., single-walled carbon nanotubes, multi-walled carbon nanotubes, and/or carbon nanostructures, etc.), a filled block copolymer system, a filled elastomeric system (e.g., cured elastomers, thermoplastic elastomers (TPEs), Santoprene thermoplastic vulcanizate, etc.), a filled thermoplastic system (e.g., polyamide, acrylonitrile butadiene styrene (ABS), polypropylene (PP), polyethylene (PE), etc.), injection moldable and/or polymer resin filled with single-walled carbon nanotubes, multi-walled carbon nanotubes, and/or carbon nanostructures, etc. The structural pattern may comprise a pattern of pyramidal structures (e.g., rectangular pyramids, pyramidal frustums with rectangular bases, pyramidal structures shown in FIGS. 1A-1E, etc.), non-pyramidal structures, or a combination of pyramidal structures and non-pyramidal structures.

With reference now to the figures, FIGS. 1A-1E illustrate an exemplary pyramidal pattern 100 for a material (e.g., film, layer, etc.) according to an exemplary embodiment. The example dimensions in centimeters (cm) are provided for purpose of illustration only. Other exemplary embodiments may include a different pattern than what is show in FIGS. 1A-1E, such as a pattern of non-pyramidal structures, structures having different dimensions, structures in a different pattern or layout, a combination of pyramidal structures and non-pyramidal structure, etc.

FIGS. 2A-2E respectively illustrate steps of an exemplary process 200 relating to fabrication of patterns (e.g., pyramidal pattern shown in FIGS. 1A-1E, non-pyramidal pattern, combination thereof, etc.) in filled dielectric systems (e.g., polydimethylsiloxane (PDMS) filled with carbon black and/or carbon nanotubes, filled block copolymer systems, filled elastomeric systems, filled thermoplastic systems, injection moldable resin filled with carbon nanotubes, polymer resin filled with carbon nanotubes, etc.) according to exemplary embodiments. Generally, this exemplary process includes a computer design to model the part, 3D printing or additive manufacturing to create the modeled part, finishing the 3D printed part for final properties (e.g., gloss, etc.), using the 3D printed part to create a mold, and using the mold (e.g., via casting, injection molding, etc.) to create a material including a pattern in a filled dielectric system.

Figures 2A, 2B, 2C, 2D, 2E:
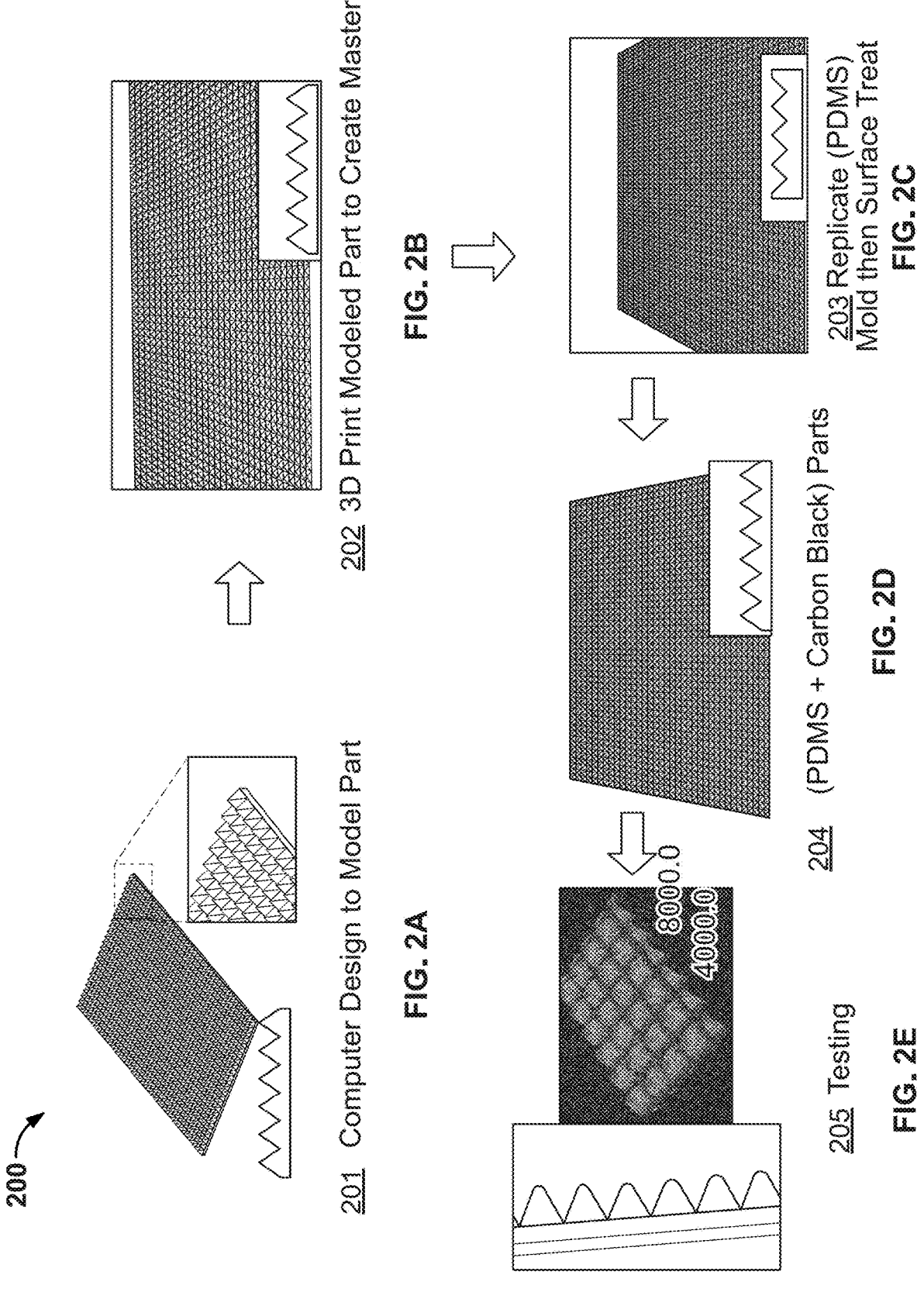

As shown in FIG. 2A, a first step 201 includes computer modeling of the 3D part, such as by using computer-aided design (CAD), etc. A second step 202 shown in FIG. 2B includes 3D printing or additive manufacturing (e.g., fused deposition molding (FDM), stereolithography (SLA), laser direct structuring (LDS), etc.) of the modeled part based on information from the computer design of the modeled part. The 3D printed part (e.g., 3D printed thermoplastic positive master, etc.) may then undergo post processing, e.g., removing excess material, post-curing, applying surface layer for matte or glossy finish, etc.

A third step 203 shown in FIG. 2C includes replicating a mold (e.g., elastomer, etc.) using the 3D printed part. For example, the 3D printed part may be used to replicate patterns into a negative mold in various ways. For example, the 3D printed part may be used to replicate patterns into a negative mold made of polydimethylsiloxane (PDMS) via fused deposition molding, stereolithography, etc. The negative mold may be surface treated, e.g., with a release layer (e.g., self-assembled monolayer, other barrier or release layer, etc.) for easier release, ultraviolet (UV) glassification, vapor phase silanization, etc.

As another example, frontal photo polymerization and polymerizable photoresists may be used to create a negative PDMS mold, e.g., from rigid thiol-ene patterns, etc. As a further example, CNC (computer numerical control) milling may be used to create a metal (e.g., aluminum, etc.) negative mold. Another example includes a frontal photopolymerization approach using thiol-ene as an optical adhesive cured on a PDMS mold under a UV lamp while on a conveyor belt (e.g., configured to make several passes under the UV lamp during the curing, etc.) of a continuous process. An additional example includes replicating patterns into thermosets to provide a mold from which parts (e.g., thermoset, thermoplastic, elastomer, etc.) can be further replicated.

A fourth step 204 shown in FIG. 2D includes creating parts made of PDMS and carbon black using the negative mold. For example, this fourth step may be performed after fabrication of the inverse PDMS mold (negative patterns) from the 3D printed master (positive pattern). In this fourth step, the negative mold is used as a starting point to fabricate a pattern (e.g., pyramidal pattern, other geometric patterns, etc.) in a filled dielectric, e.g., PDMS filled with carbon black, injection moldable resin filled with carbon nanotubes, polymer resin filled with carbon nanotubes, etc. A mixture of PDMS and carbon black (or other filled dielectric system) may be applied (e.g., poured, etc.) onto the negative mold and then undergo degassing and oven curing before the PDMS/carbon black part is removed from (e.g., peeled off, etc.) the negative mold.

A fifth step 205 shown in FIG. 2E may include testing the molded PDMS and carbon black parts. For example, the height and width of the patterns fabricated on the molded parts may be analyzed. Or, for example, the molded parts may undergo reflectivity testing. As another example, the negative PDMS mold may undergo durability testing to determine how many molded parts (e.g., at least 20 filled elastomer parts, etc.) may be created with a single mold before the height and pattern fidelity starts to degrade following the casting of multiple parts from the single mold.

In alternative exemplary embodiments, other processes may alternatively or additionally be used to make materials having patterns in filled dielectric systems. Example processes include roll to roll processes, such as a roll to roll patternable polymer process for continuous pattern replication, a roll to roll process including multiple nozzles for dispensing materials simultaneously onto a film or layer, etc. Other example processes include extrusion, curtain coating, 3D printing or additive manufacturing (e.g., fused deposition molding, stereolithography, laser direct structuring with molding, etc.), frontal photo polymerization with photomask and/or with soft master, CNC (computer numerical control) milling, injection or compression molding (e.g., using thermoset molds, etc.), soft molding (e.g., using pre-molded (crosslinked) PDMS molds, etc.), UV systems with conveyor belts thermoplastic replication, thermoset master, thiol-ene with a soft master, inkjetting (e.g., inkjetting dielectrics onto metal for insulation, etc.), screen printing, spraying, laser welding of discrete layers (e.g., at varying depths into different layers, etc.), laser patterning onto polyimide film to allow plating (e.g., plating for FSS elements, etc.), casting, injection molding, rolling/forming processes, integrated parts containing pyramid surfaces in design, etc.

In an exemplary embodiment, a 3D printed mold insert may be used along with a compression or injection molding process. Pattern fabrication may be performed in a vacuum oven. For example, a 3D printed master may be placed on a metal sheet. A flat composite sheet (e.g., polycaprolactone filled with carbon black, etc.) made by compression molding may then be placed onto the 3D printed master and surrounded by a bracket. Weight (e.g., metal block etc.) may be placed on top of the composite sheet. The pattern is created in the composite sheet from the negative pattern of the 3D printed master using the gravity of the weight atop the composite sheet. The materials are heated in an oven and then removed from the oven. The materials are allowed to cool before the composite is separated from the 3D printed master.

In an exemplary embodiment, a roll to roll process may be used to make materials having patterns in filled dielectric systems. This process may include roll to roll self-aligning self-patterning block copolymer having sufficient particle loading for good or satisfactory performance. A patterned PDMS belt may be used to pattern along with heating plates, which may be a tunnel oven, etc. The patterned PDMS belt may include multiple negatively patterned (e.g., silicone, etc.) parts having their ends bonded or joined together with PDMS. The PDMS may be cured along the joints between the ends of the negatively patterned parts. The patterned PDMS belt is wrapped around rollers. The rollers may be spaced apart by a sufficient distance to avoid sagging of the patterned PDMS belt.

During the roll to roll process, a carrier (e.g., aluminum carrier with a release layer, etc.) for an uncured mixture of PDMS and carbon black (or other filled dielectric system) is moved across the heating plate. The patterned PDMS belt contacts the uncured mixture of PDMS and carbon black. After a sufficient amount of contact time with the patterned PDMS belt that allows mold filling to be completed, the process may begin for curing the uncured mixture of PDMS and carbon black. The cured PDMS and carbon black part may then be removed from (e.g., peeled off, etc.) the patterned PDMS belt and the carrier.

In an exemplary embodiment, a stepwise deposition process may be used to provide patterns (e.g., pyramidal pattern shown in FIGS. 1A-1E, non-pyramidal pattern, combination thereof, etc.) along a material. In this exemplary embodiment, the process may include the stepwise deposition of materials (e.g., thermally-conductive, electrically-conductive, EMI absorbing, magnetic, and/or dielectric materials, etc.) onto a functional carrier film. The functional carrier film may comprise a filled dielectric system, such as polydimethylsiloxane (PDMS) filled with carbon black, a filled block copolymer system, a filled elastomeric system (e.g., cured elastomers, thermoplastic elastomers (TPEs), Santoprene thermoplastic vulcanizate, etc.), a filled thermoplastic system (e.g., polyamide, acrylonitrile butadiene styrene (ABS), polypropylene (PP), polyethylene (PE), etc.), injection moldable resin filled with carbon nanotubes, polymer resin filled with carbon nanotubes, etc. The functional carrier film may comprise Kapton polyimide film, Mylar polyester film, a thermoplastic film usable with stereolithography (SLA) printing, etc.

In exemplary embodiments, materials may be deposited or otherwise applied onto the functional carrier film by spraying, printing, additive manufacturing, etc. For example, materials may be applied to a functional carrier film by laser jet printing a first layer of material (e.g., electrically-conductive and/or thermally-conductive ink, etc.) onto the functional carrier film. A second layer of the same or different material may be laser jet printed on top of the first layer. This may be performed as part of a roll to roll process along which a laser jet printer has been added.

In exemplary embodiments, a film or layer may be provided with materials thereon have different thicknesses or heights to accommodate for variances in the height of shorter and taller PCB components. For example, an additive manufacturing process may be used to apply a thermally-conductive material of different thicknesses along a bottom layer of a multilayer film structure such that the thicker and thinner thermally-conductive material portions will be disposed over and compressively contact the top surfaces of shorter and taller PCB components, respectively, when the multilayer film structure is installed over the PCB components. As another example, additive manufacturing may be used to apply thermally-conductive material along the top surfaces of shorter PCB components to thereby increase an overall height of the shorter components plus the thermally-conductive material.

In exemplary embodiments, a bottom film or layer of a multilayer film structure may be configured to allow the multilayer film structure to be removably detachable from and reattachable to a PCB, e.g., via tack, adhesive, mechanical attachment, etc. For example, the multilayer film structure may be attached to, removed from (e.g., for accessing the PCB components, etc.), and reattached to the PCB without damaging (e.g., without cutting, without deformation from stretching, etc.) the multilayer film structure.

The above described processes may be used to provide a wide variety of patterns of different structural shapes (e.g., rectangular pyramids, pyramidal structures, non-pyramidal structures, combinations thereof, etc.), including the exemplary patterns of structures shown in FIGS. 5 through 15. A pattern of structures may also be provided by other suitable processes. For example, a pattern of structures may comprise a multilayer film, a single-layer film, or a homogeneous layer/film with through-thickness domains tailored for a specific performance as disclosed herein. Or, for example, a pattern of structures may comprise metamaterial.

In exemplary embodiments, a multilayer film (broadly, a multilayer structure) includes multiple block copolymer films or layers having through-thickness domains. By way of example, the block copolymer may comprise polystyrene-polyethylene block copolymer (e.g., polystyrene-block-poly(ethylene oxide) (PS-b-PEO), etc.), polystyrene-acrylate block copolymer (e.g., polystyrene and poly(methyl methacrylate) (PS-PMMA), etc.), styrene-diene block copolymer (e.g., styrene-butadiene (SB) diblock copolymer, styrene-isoprene diblock copolymer, styrene-butadiene-styrene (SBS) triblock copolymer, styrene-isoprene-styrene (SIS) triblock copolymer, styrene-butadiene (SB) star block copolymer, etc.), hydrogenated styrene-diene block copolymer (e.g., hydrogenated SBS styrene-(ethylene-butylene)-styrene, etc.), segmented block copolymer (e.g., segmented polyester-polyether, segmented polyamide-polyether, etc.), polyolefinic block copolymer, ethylene oxide/propylene oxide block copolymer, organosilicone copolymer system (e.g., siloxane/polysulfone copolymer, siloxane/polyurethane, siloxane/polyurea copolymer, siloxane/polyamide copolymer, siloxane/polyimide copolymer, siloxane/polyamide/polyimide copolymer, siloxane/polyester copolymer, siloxane/polycarbonate copolymer, siloxane/polystyrene copolymer, siloxane/epoxide resin networks, etc.), hard block copolymer, other block copolymers, and/or combinations thereof. In an exemplary embodiment, the block copolymer films or layers comprise polystyrene-block-poly(ethylene oxide) (PS-b-PEO) and/or polystyrene and poly(methyl methacrylate) (PS-PMMA) although other block copolymers may be used in other exemplary embodiments.

A specific filler(s) may be added to a domain preferentially, thereby enhancing a characteristic of that domain of the block copolymer film. In exemplary embodiments disclosed herein, one or more fillers are added to domains of multiple block copolymer films to thereby tailor the domains of the multiple block copolymer films for specific performance(s), (e.g., thermal management, electromagnetic interference (EMI) mitigation, electrical conductivity, thermal conductivity, EMI absorbing, magnetic, dielectric, and/or structural performance, etc.).

The multiple block copolymer films having the tailored domains may be assembled (e.g., laminated, stacked, etc.) into a multilayer structure (e.g., a laminate structure, etc.). The multilayer structure may be manufactured by a roll to roll process, spin casting, extrusion, curtain coating, 3D printing, additive manufacturing (e.g., fused deposition molding (FDM), stereolithography (SLA), laser direct structuring (LDS), etc.), molding, etc.

In exemplary embodiments, vertical orientation control and preferential segregation/dispersion of fillers (e.g., functional nanoparticles, nickel cobalt, boron nitride, coated filler particles, etc.) may be used to tailor through-thickness domains of individual films or layers to have specific electrical, thermal, magnetic, dielectric, and/or structural performance. By controlling the domain size, shape, and structure within the multiple films or layers, the domains may be configured to create a pattern (e.g., a macropattern or hierarchical pattern based on patterns in the individual layers, etc.) or a gradient (e.g., an impedance gradient built across domains of the multilayer block copolymer films/layers by filler loading, etc.), etc.

The domains may be configured such that the multiple layers have different functions. The domains within one layer may be configured (e.g., for controlled performance, etc.) different than or the same as the domains of one or more other layers.

The multiple films or layers may be configured differently from one another. For example, the films or layers may have different thicknesses, may include different fillers (e.g., different materials, sizes, and/or shapes, etc.), may be made from different base or matrix materials, may have differently configured domains (e.g., tailored to have different functions, different sizes, different locations, etc.), etc.

For example, a multilayer film structure may comprise a plurality of films or layers, at least one or more of which comprises a different base or matrix material and/or different type of filler than at least one or more of the other films or layers. In this example, the multilayer film structure may comprise a first film or layer comprising a first base or matrix material and a first type of filler (e.g., thermally-conductive filler, etc.). The multilayer film structure may further comprise a second film or layer comprising a second base or matrix material different than the first base or matrix material, and a second type of filler (e.g., electrically-conductive and/or EMI absorbing filler, etc.) different than the first type of filler.

Alternative exemplary embodiments may include polymer films/layers that are homogeneous or single-layer structures and/or that are not segregated block copolymers. For example, a homogeneous or single-layer film structure may include tailored through-thickness domains spaced apart from each other within the homogenous or single-layer film structure to have specific electrical, thermal, magnetic, dielectric, and/or structural performance. Vertical orientation control and preferential segregation/dispersion of fillers (e.g., functional nanoparticles, nickel cobalt, boron nitride, coated filler particles, etc.) may be used to space apart and tailor the through-thickness domains within the homogeneous or single-layer film structure. By controlling the domain size, shape, and structure within the homogeneous or single-layer film structure, the domains may be configured to create a pattern (e.g., a macropattern or hierarchical pattern based on patterns in the individual layer, etc.) or a gradient (e.g., an impedance gradient built across domains of the individual layer by filler loading, etc.), etc. The domains may be configured such that the different spaced apart portions of the homogeneous or single-layer film structure have different functions. The domains within first and second spaced apart portion of the homogeneous or single-layer film structure may be configured (e.g., for controlled performance, etc.) differently or the same as each other.

FIG. 3 illustrates a multilayer film structure 300 according to an exemplary embodiment embodying one or more aspects of the present disclosure. As shown, the multilayer film structure 300 includes four films or layers 302, 304, 306, 308 and through-thickness domains 310, 312, 314, 316, respectively, in each of the four layers. In alternative embodiments, the multilayer film structure may be configured differently, e.g., with more or less than four layers, more or less through-thickness domains, etc.

The domains within the individual layers may be tailored to have specific characteristics, properties, functions, and/or performance, e.g., electrical, thermal, magnetic, dielectric, and/or structural, etc. By way of example, domains 310 in the first or top layer 302 may be configured for thermal performance. The domains 312, 314 in the respective second and third layers 304, 306 may be configured for EMI mitigation, e.g., electrically-conductive, EMI absorbing, magnetic, etc. The domains 316 in the fourth or bottom layer 308 may be configured for dielectric performance.

The domains in the individual layers may create a pattern tailored or unique to that individual layer. The patterns of the individual layers may cooperate to define or create a macropattern (e.g., through the thickness of, etc.) in the multilayer film structure. For example, domains of one layer may be vertically aligned and/or at least partially overlapping with domains of another layer such that the vertically aligned and/or at least partially overlapping domains within the layers cooperate to define a pathway (e.g., electrically-conductive and/or thermally-conductive pathway, via, column, etc.) vertically through the thickness of the layers.

In an exemplary embodiment, domains of the different layers may include vertically aligned thermally-conductive and/or electrically-conductive fillers that create a vertical through-thickness conductive pathway through the different layers. For example, a thermal pathway may be created that has a relatively high thermal conductivity, which may be sufficiently high enough to provide good performance even if the multilayer film structure has a relatively high contact resistance. Depending on the contact resistance of the multilayer film structure, a relatively thin, soft and conformable thermally-conductive layer may be added for reduced contact resistance and better thermal performance.

Block copolymer may be used as the base or matrix material 320 for one or more of the four films 302, 304, 306, 308 shown in FIG. 3. For example, polystyrene-block-poly (ethylene oxide) (PS-b-PEO) may be used as the base or matrix material 320 for only one, two, three, or all films of the multilayer film structure 300. Or, for example, polystyrene and poly(methyl methacrylate) (PS-PMMA) may be used as the base or matrix material 320 for only one, two, three, or all films of the multilayer film structure 300. A different polymer may instead be selected that allows for larger domain sizes than the domain sizes achievable with polystyrene-block-poly(ethylene oxide) (PS-b-PEO) and/or polystyrene and poly(methyl methacrylate) (PS-PMMA). In other embodiments, different base or matrix materials may be used for one or more of the films, such as polystyrene-polyethylene block copolymer, another polystyrene-acrylate block copolymer, styrene-diene block copolymer (e.g., styrene-butadiene (SB) diblock copolymer, styrene-isoprene diblock copolymer, styrene-butadiene-styrene (SBS) triblock copolymer, styrene-isoprene-styrene (SIS) triblock copolymer, styrene-butadiene (SB) star block copolymer, etc.), hydrogenated styrene-diene block copolymer (e.g., hydrogenated SBS styrene-(ethylene-butylene)-styrene, etc.), segmented block copolymer (e.g., segmented polyester-polyether, segmented polyamide-polyether, etc.), polyolefinic block copolymer, ethylene oxide/propylene oxide block copolymer, organosilicone copolymer system (e.g., siloxane/polysulfone copolymer, siloxane/polyurethane, siloxane/polyurea copolymer, siloxane/polyamide copolymer, siloxane/polyimide copolymer, siloxane/polyamide/polyimide copolymer, siloxane/polyester copolymer, siloxane/polycarbonate copolymer, siloxane/polystyrene copolymer, siloxane/epoxide resin networks, etc.), hard block copolymer, other block copolymers, and/or combinations thereof.

A wide variety of fillers may be incorporated into the base or matrix material 320 of a film to tailor, modify, and/or functionally tune property(ies) of the resulting film. The fillers may include functional nanoparticles, electrically-conductive fillers, thermally-conductive fillers, EMI or microwave absorbing fillers, magnetic fillers, dielectric fillers, coated fillers, combinations thereof, etc. The fillers may be added and mixed into a bulk material including the base or matrix material to thereby provide a mixture of the filler and base or matrix material. Example fillers include carbon black, boron nitride, nickel cobalt, air-filled microballoons, air-filled microbubbles, air-filled microspheres, carbonyl iron, iron silicide, iron particles, iron-chrome compounds, silver, an alloy containing 85% iron, 9.5% silicon and 5.5% aluminum, an alloy containing about 20% iron and 80% nickel, ferrites, magnetic alloys, magnetic powders, magnetic flakes, magnetic particles, nickel-based alloys and powders, chrome alloys, aluminum oxide, copper, zinc oxide, alumina, aluminum, graphite, ceramics, silicon carbide, manganese zinc, fiberglass, carbon nanotubes (e.g., single-walled carbon nanotubes, multi-walled carbon nanotubes, and/or carbon nanostructures, etc.), combinations thereof, etc. The fillers may comprise one or more of granules, spheroids, microspheres, ellipsoids, irregular spheroids, strands, flakes, powder, nanotubes, and/or a combination of any or all of these shapes. In addition, exemplary embodiments may also include different grades (e.g., different sizes, different purities, different shapes, etc.) of the same (or different) fillers.

In an exemplary embodiment, the films of a multilayer film structure (e.g., films 302, 304, 306, and/or 308 of the multilayer film structure 300 shown in FIG. 3, etc.) may be made by casting, film extrusion, lamination, etc.

FIG. 4 illustrates an exemplary embodiment of a multilayer film structure 400 (e.g., a four-layer film structure, etc.) according to an exemplary embodiment embodying one or more aspects of the present disclosure. In this exemplary embodiment, filler density per layer increases in a direction from the top layer 402 to the bottom layer 408. Accordingly, the bottom layer 408 has the highest filler density while the top layer 402 has the lowest filler density. Regarding the two intermediate layers 404, 406 between the top and bottom layers 402, 408 the lower intermediate layer 406 has a higher filler density than the upper intermediate layer 406. The overall thickness or height dimension of the multilayer film structure 400 may be about 1.7 millimeters (mm). But this 1.7 mm dimension is provided for purpose of illustration only as multilayer film structures may be thicker or thinner than 1.7 mm in other embodiments. In addition, the multilayer film structure 400 shown in FIG. 4 includes four layers 402, 404, 406, 408, but other exemplary embodiments may include a multilayer film structure with more or less than four layers.

In exemplary embodiments, a multilayer film structure may include films with functionality in segregated discrete areas, e.g., for electrical, thermal, absorber, magnetic, dielectric, and/or structural, etc. For example, a multilayer film structure may include films configured to have thermal management functionality, EMI shielding functionality, and EMI absorbing functionality in segregated discrete areas of the multilayer film structure.

A multilayer film structure may have differential loading within the layers or films for different performance, effects, etc. For example, a multilayer film structure may have differential loading from layer to layer, which differential loading may be operable for mitigating EMI (e.g., absorbing high frequency EMI, etc.) in a way similar to the EMI mitigation provided by the pyramidal or non-pyramidal structures shown in FIGS. 5-15 and 21 and described herein.

In exemplary embodiments, a multilayer film structure and/or patterned material may be provided with a backing, such as via a metallization process, lamination, tape casting, vacuum deposition, other suitable processes, combinations thereof, etc. The backing may comprise one or more metals (e.g., aluminum, copper, etc.), coated metal (e.g., nickel coated aluminum, etc.), clad metal, metallized polymer film/plastic, aluminized Mylar biaxially-oriented polyethylene terephthalate (BoPET), other backing materials, a combination thereof, etc. For example, a backing including metal (e.g., aluminum, copper, etc.) may be provided (e.g., via a metallization process, etc.) along an outer exposed surface of a multilayered film structure, such as the bottom surface of the multilayer film structure 300 and/or 400 respectively shown in FIG. 3 or FIG. 4, etc. Or, for example, a backing including metal (e.g., aluminum, copper, etc.) may be provided (e.g., via a metallization process, etc.) along the bottom surface of a patterned material, such as the bottom surface of the patterned material 500, 600, and/or 2100 respectively shown in FIG. 5, 6, or 21, etc.

In exemplary embodiments, a multilayer film structure and/or patterned material may have a relatively high contact resistance depending on the materials used. Or, for example, the multilayer film structure and/or patterned material may be provided with one or more thermally-conductive pillars or columns (broadly, portions) having very high thermal conductivity to help compensate for and/or overcome relatively high contact resistance.

In exemplary embodiments, one or more thermal interface materials, heat spreaders, thermoelectric modules, etc. may be used with a multilayer film structure and/or patterned material. For example, a heat spreader (e.g., a graphite heat spreader, etc.) may be disposed along (e.g., laminated to, sealed between films via laser welding, etc.) the multilayer film structure. Or, for example, a thermoelectric module may be disposed along the multilayer film structure.

As another example, a thermal interface material(s) may be disposed along a top surface and/or bottom surface of the multilayer film structure. In this latter example, the thermal interface material(s) may help to accommodate for variances in the height of shorter and taller PCB components. For example, thermal interface materials may be located along a bottom surface of a multilayer film structure so that the thermal interface materials will be disposed over and compressively contact the top surfaces of the PCB components when the multilayer film structure is installed over the PCB components. Thermal interface materials may also be located along a top surface of a multilayer film structure so that the thermal interface materials compressively contact a heat spreader (e.g., an exterior case or device housing, etc.). Example thermal interface materials include thermal gap fillers, thermal phase change materials, thermally-conductive EMI absorbers or hybrid thermal/EMI absorbers, thermal greases, thermal pastes, thermal putties, dispensable thermal interface materials, thermal pads, etc.

Exemplary embodiments may include one or more radiating antenna elements defined or created by domains in one or more of layers or films of a multilayer film structure, homogenous film structure, or single-layer film structure. Exemplary embodiments may include a film structure (e.g., a multilayer film structure, a homogenous film structure, a single-layer film structure, etc.) including one or more layers or films configured to (e.g., have domains tailed to, etc.) provide environmental protection (e.g., vapor or oxygen barriers, etc.). Exemplary embodiments may include one or more wave guides defined or created by domains in one or more of layers or films of a multilayer film structure of a multilayer film structure, homogenous film structure, or single-layer film structure. Accordingly, exemplary embodiments may include multilayer film structures having multiple layers or films with domains configured to provide one or more radiating antenna elements, one or more wave guides, EMI mitigation, thermal management, dielectric properties, structure, and/or environmental protection, etc. Exemplary embodiments may also include homogeneous or single-layer film structures having a single or individual layer or film with domains configured to provide one or more radiating antenna elements, one or more wave guides, EMI mitigation, thermal management, dielectric properties, structure, and/or environmental protection, etc.

FIGS. 5-15 and 21 illustrate exemplary structures (e.g., pyramidal structures, non-pyramidal structures, etc.) configured for EMI mitigation (e.g., absorbing high frequency, etc.) according to exemplary embodiments embodying one or more aspects of the present disclosure. In exemplary embodiments (e.g., FIGS. 7-15, etc.), the structures may be disposed along (e.g., adhered to, etc.) and protrude outwardly from a portion of a board level shield (BLS). For example, the structures may protrude outwardly from an inner surface and/or outer surface of a BLS top, cover, lid, sidewall(s), fence, frame, etc. The BLS may be configured (e.g., made of metal, shaped, sized, etc.) for mitigating (e.g., blocking, reflecting, etc.) low frequency EMI. The structures may be configured (e.g., made of EMI absorbing materials, shaped, sized, etc.) for mitigating (e.g., absorbing, etc.) high frequency EMI.

Figure 15:
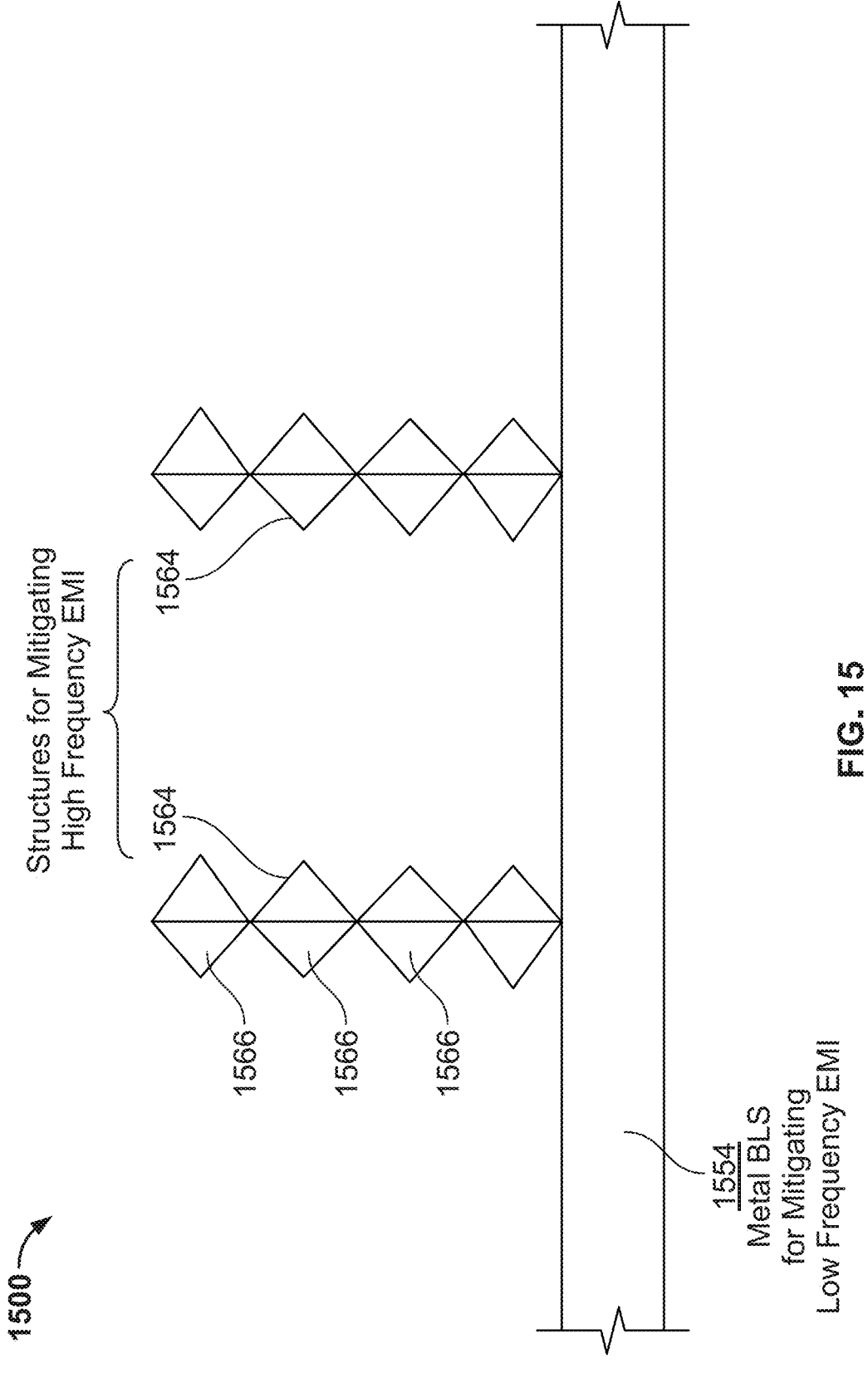
FIG. 15 illustrates non-pyramidal structures along a portion of a BLS according to an exemplary embodiment.

FIGS. 5-15 and 21 illustrate exemplary pyramidal structures that are rectangular pyramids. The rectangular bases of adjacent pyramids may contact each other substantially without any gaps or spaced distances between the rectangular bases. This helps avoiding reflectivity that might otherwise occur if there were gaps between the rectangular bases of the pyramidal structures. Other exemplary embodiments may include non-pyramidal structures that taper or decrease (e.g., curve generally smoothly, etc.) in width from the top (e.g., from a point, etc.) towards the base. For example, FIGS. 14 and 15 illustrate exemplary embodiments including non-pyramidal structures 1400, 1500, respectively. Alternative exemplary embodiments may include structures having non-rectangular bases, e.g., hexagonal bases, triangular bases, etc. Accordingly, the present disclosure should not be limited to only rectangular pyramidal structures as other exemplary embodiments may include structures having different three-dimensional geometric shapes.

In exemplary embodiments, the sides of the structures may not be perfectly smooth or define a perfectly straight line from top to bottom. For example, the sides may appear to have a stepped configuration when viewed at high magnification. But the sides of the pyramidal or non-pyramidal structures may preferably be relatively smooth (e.g., without any significantly sized steps, etc.) to reduce or avoid reflection of EMI incident on the structures. In addition, the structures may be configured to have a varying slope or taper (e.g., at least two or more slopes, etc.) along the sides. For example, a pyramidal structure may have a relatively gradual taper from the base towards a middle portion, a quicker taper from the middle portion towards the top, and then less taper therefrom to the top of the structure.

The structures shown in FIGS. 5-15 and 21 may be made by the process shown in FIGS. 2A-2E and described above. The structures shown in FIGS. 5-15 and 21 may comprise a filled dielectric, such as polydimethylsiloxane (PDMS) filled with carbon black, a filled block copolymer system, a filled elastomeric system, a filled thermoplastic system, etc. Alternatively, the structures shown in FIGS. 5-15 and 21 may be made of other materials and/or by other suitable processes (e.g., a stepwise deposition of material onto a functional carrier film, etc.). The structures may comprise one or more first structures along a first layer, and one or more second structures along a second layer. The first and second structures may be configured differently, e.g., different shapes, different heights, made of different materials, etc.

In exemplary embodiments, the configuration (e.g., height, shape, location, etc.) of the structures may be non-randomized or randomized (e.g., via a computerized randomization process, etc.). Randomizing height of the structures along a BLS interior may help to reduce or avoid cavity resonance underneath the BLS. Exemplary embodiments may include rectangular pyramidal structures having the same size base but one or more of the rectangular pyramidal structures may have a different height than one or more other rectangular pyramidal structures. For example, taller pyramids may be located along the edges or outer perimeter, while shorter pyramids may be located in a middle or interior portion spaced inwardly from the edges or outer perimeter.

Structures having different heights may be used to accommodate for variances in the height of shorter and taller PCB components. For example, taller and shorter structures may be located along an inner surface of a BLS cover or lid so that the taller and shorter structures are disposed generally over shorter and taller PCB components, respectively, when the BLS is installed over the PCB components. The different heights of the structures may also help to avoid or reduce cavity resonance underneath the BLS.

Figure 5:
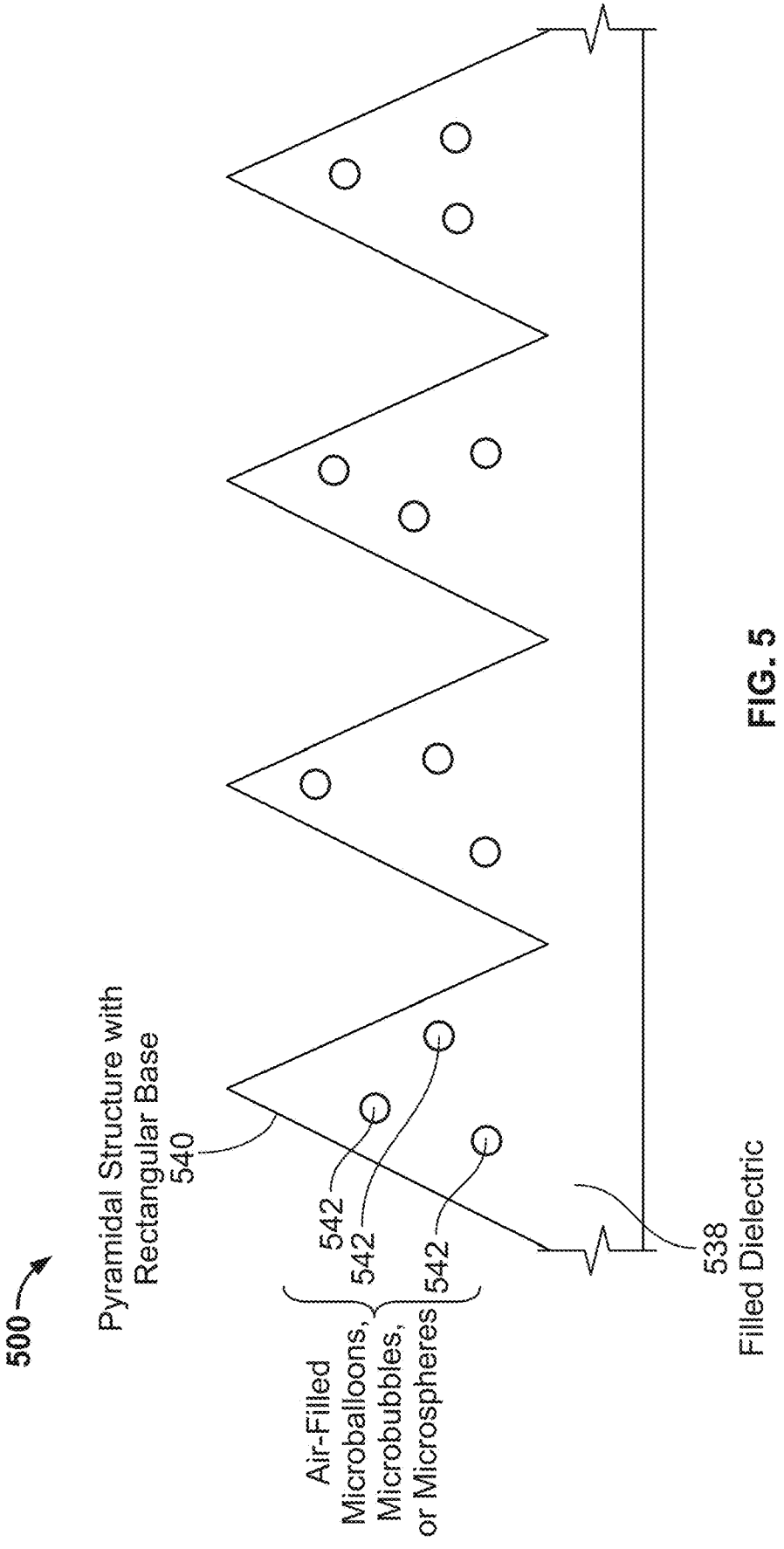
FIG. 5 illustrates a filled dielectric having pyramidal structures according to an exemplary embodiment in which the pyramidal structures include air-filled microballoons, microspheres, or microbubbles therein.

FIG. 5 illustrates filled dielectric 538 including pyramidal structures 540 according to an exemplary embodiment 500 embodying one or more aspects of the present disclosure. As shown, the pyramidal structures 540 include air-filled particles 542 (e.g., air-filled microballoons, air-filled microbubbles, air-filled microspheres, etc.) within the filled dielectric 538. The air-filled particles 542 add air to the pyramidal structures 540, which decreases (e.g., controllably decreases, etc.) the dielectric constant. With the air-filled particles 542 therein, the dielectric constant of the pyramidal structures 540 may approximate the dielectric constant of foam and/or approach foam dielectric properties.

Additionally or alternatively to being loaded or filled with air-filled particles 542, pyramidal and/or non-pyramidal structures may be covered or coated with polymer including air-filled particles (e.g., air-filled microballoons, air-filled microbubbles, air-filled microspheres, hollow glass, plastic, and/or ceramic microspheres, other microspheres, etc.) in other exemplary embodiments. For example, an exemplary embodiment may include pyramidal structures coated or covered with micro-balloon filled polymer, e.g., for environmental resistance, etc. In this example, the micro-balloon filled polymer may cover the pyramidal structures and define a planarization layer for filling in the spaces between the pyramidal structures. The inverse pyramidal structures of the planarization micro-balloon filled polymer layer may interleave or interlace with the pyramidal structures such that the combined pyramidal structures and planarization micro-balloon filled polymer layer have a generally flat sheet-like configuration. The planarization micro-balloon filled polymer layer may be operable to inhibit or prevent dirt and/or other debris from filling the spaces, pores, openings, gaps, etc. between the pyramidal structures. By way of example, the micro-balloon filled polymer may comprise a low dielectric loss, low dielectric constant (e.g., less than 10, between 1 and 2, less than 1, etc.) material, such as Laird's LoK low dielectric loss, low dielectric constant material including thermosetting plastic or silicone rubber and hollow glass microspheres, etc. Alternatively, other materials (e.g., including materials that are not low dielectric loss, low dielectric constant materials and/or that do not include hollow glass microspheres, etc.) may be used for defining a planarization layer and/or for covering or coating pyramidal and/or non-pyramidal structures to inhibit or prevent dirt and/or other debris from filling the spaces, pores, openings, gaps, etc. between the pyramidal and/or non-pyramidal structures in other exemplary embodiments. Accordingly, aspects of the present disclosure include methods of inhibiting or preventing dirt and/or other debris from filling the spaces, pores, openings, gaps, etc. between the pyramidal and/or non-pyramidal structures disclosed herein.

Figure 6:
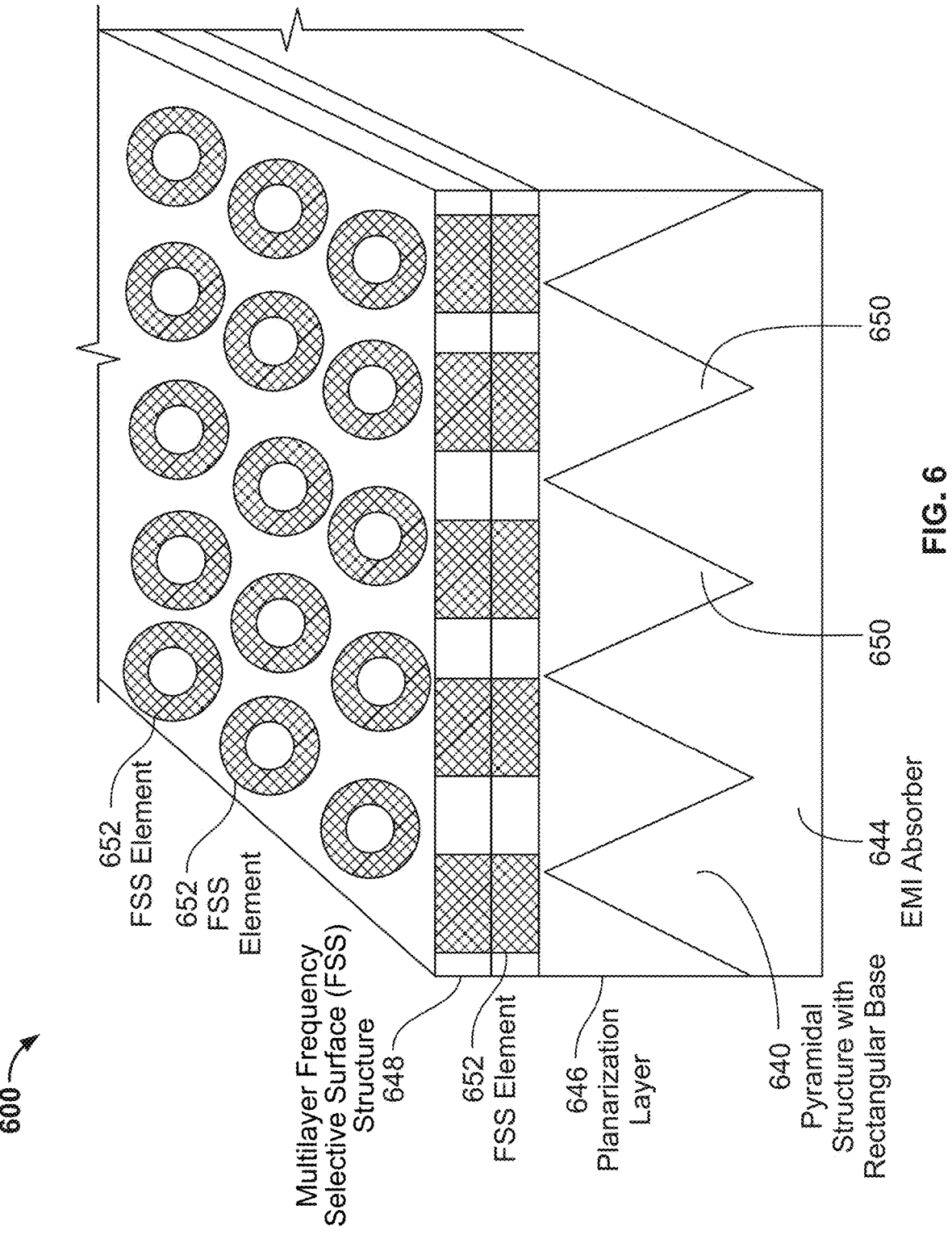
FIG. 6 illustrates an exemplary embodiment including pyramidal structures, a planarization layer, and a multilayer frequency selective surface (FSS) structure.

FIG. 6 illustrates an EMI absorber 644 including pyramidal structures 640, a planarization layer 646, and a multilayer frequency selective surface (FSS) structure 648 according to an exemplary embodiment 600 embodying one or more aspects of the present disclosure. As shown, the EMI absorber 644 and pyramidal structures 640 may comprise polydimethylsiloxane (PDMS) filled with carbon black, a filled block copolymer system, a filled elastomeric system (e.g., cured elastomers, thermoplastic elastomers (TPEs), Santoprene thermoplastic vulcanizate, etc.), a filled thermoplastic system (e.g., polyamide, acrylonitrile butadiene styrene (ABS), polypropylene (PP), polyethylene (PE), etc.), injection moldable resin filled with carbon nanotubes, polymer resin filled with carbon nanotubes, etc.

As shown in FIG. 6, the planarization layer 646 includes or defines inverse downwardly protruding pyramidal structures 650 for filling in the spaces between the upwardly protruding pyramidal structures 640 of the EMI absorber 644. The inverse pyramidal structures 650 of the planarization layer 646 may interleave or interlace with the pyramidal structures 640 such that the combination of the EMI absorber 644 and planarization layer 646 has a generally flat sheet-like configuration.

The planarization layer 646 may comprise a dielectric material (e.g., graded dielectric for impedance matching, a uniform dielectric planarization layer, etc.), a thermally-conductive material, an electrically-conductive material, etc. The planarization layer 646 may help reinforce the pyramidal structures, protect against breakage of the pyramidal structures 640, provide adhesion, provide stiffness or structure for attachment purposes and/or adjusting modulus of elasticity, and/or inhibit or prevent dirt and/or other debris from filling the spaces, pores, openings, gaps, etc. between the pyramidal structures 640. The planarization layer 646 may be provided with different thicknesses to accommodate for variances in the height of shorter and taller components of a PCB, SIP, etc.

In exemplary embodiments in which the planarization layer is electrically conductive, one or more dielectric materials (e.g., a thin dielectric layer, etc.) may be provided along exposed outer surface portions of the planarization layer so as to avoid shorting of adjacent device components by the electrically-conductive planarization layer. As another example, dielectric material may be embedded in a thermal interface material (TIM) when the TIM is used (e.g., injection molded, etc.) as the planarization layer. The planarization layers (e.g., 646 shown in FIG. 6, etc.) described herein may also be used in other exemplary embodiments that include EMI absorbing structures (e.g., FIGS. 5, 7-15, and 21, etc.).

Figure 19:
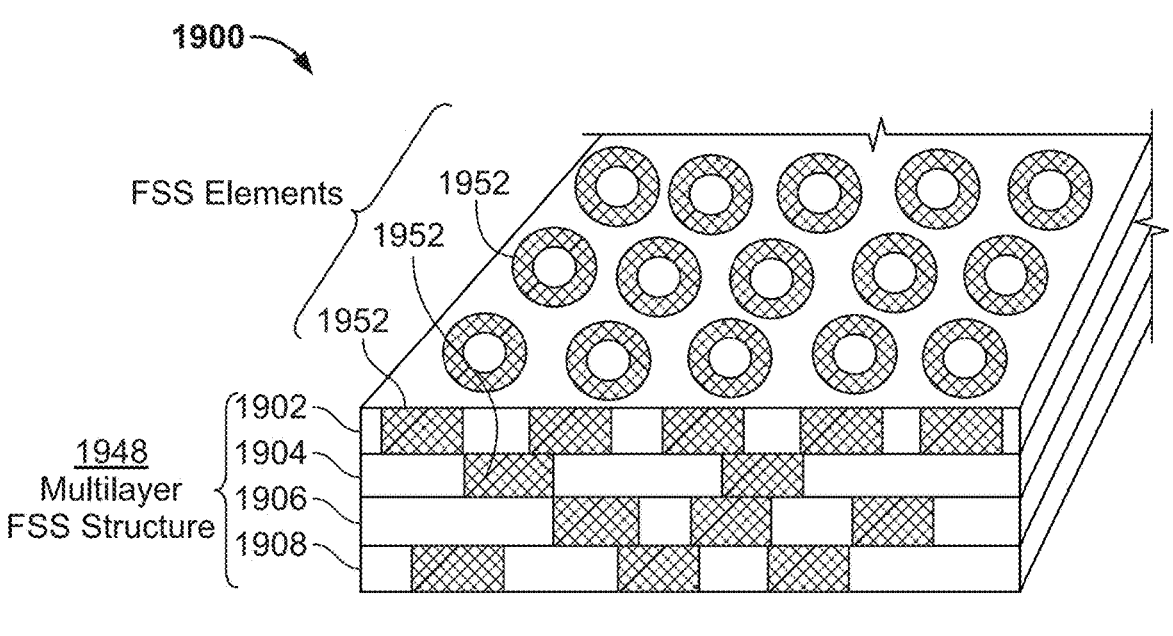
FIG. 19 illustrates a multilayered frequency selective surface (FSS) structure including patterns of electrically-conductive, EMI absorbing, and/or metamaterial elements according to an exemplary embodiment.

The multilayered frequency selective surface (FSS) structure 648 shown in FIG. 6 includes multiple (e.g., three, etc.) layers of FSS elements 652. Alternative embodiments may include an FSS structure having more or less than three layers, e.g., a single layer, two layers, four layers, etc. For example, FIG. 19 illustrates an exemplary embodiment 1900 of a multilayered FSS structure 1948 including four layers 1902, 1904, 1906, 1908 of FSS elements 1952. Or, for example, exemplary embodiments may include a single layer of FSS elements, multiple coplanar rings in a single plane, an electrically-conductive metamaterial in a pattern on a dielectric along an underside of a BLS and/or along a ground plane, etc. Accordingly, the present disclosure should not be limited to only three or four layered FSS structures.

As shown in FIGS. 6 and 19, the layers of the multilayered frequency selective surface (FSS) structures 648, 1948, respectively, include patterns of FSS elements 652, 1952. The FSS elements may comprise electrically-conductive material, EMI absorbing material, and/or metamaterial.

In the illustrated embodiments of FIGS. 6 and 19, the FSS elements 652, 1952 comprise annular elements (e.g., circular rings, generally round annular elements, etc.) having open areas or openings. By way of example, the open areas or openings may include perforations or holes die cut in the layers for airflow before or after the FSS elements are provided (e.g., laser patterned onto layers, etc.). Or, for example, the open areas or openings may be formed by etching or washing cured/uncured polymer away from the FSS elements. As another example, the FSS layers may be made using a mold configured to create the open areas or openings.

As shown in FIG. 6, the multiple layers of the multilayered FSS structure 648 may be in a stacked arrangement (e.g., a laminate structure, etc.) such that the FSS elements 652 of each layer overlap and vertically align with the FSS elements 652 in the other layers. The openings or open areas of each layer are thus vertically aligned with the openings or open areas of the other layers. Accordingly, the FSS elements 652 may be used for mitigating EMI without completely blocking the flow of air and/or liquid through the multilayered FSS structure, as air and/or liquid may flow within the vertically aligned openings or open areas. Alternative embodiments may include a multilayered FSS structure (e.g., 1948 shown in FIG. 19, etc.) configured such that all FSS elements do not overlap and do not vertically align with other FSS elements and/or include FSS elements configured without the openings or open areas.

In exemplary embodiments, the films or layers of a multilayered FSS structure (e.g., 648 (FIG. 6), 1948 (FIG. 19), etc.) may comprise block copolymer, polydimethylsiloxane (PDMS), thermoplastic films prepared by process(es) disclosed herein, etc.

A multilayered FSS structure (e.g., 648 (FIG. 6), 1948 (FIG. 19), etc.) may include multiple films or layers with FSS elements provided by a process disclosed herein. By way of example, an FSS structure may include FSS elements comprising copper and films or layers comprising Mylar biaxially-oriented polyethylene terephthalate (BoPET). In this example, copper patterns of FSS elements may be etched onto the Mylar BoPET films or layers using FR4/PCB manufacturing processes. As another example, FSS elements may be provided along the films or layers by 3D printing or additive manufacturing (e.g., fused deposition molding, stereolithography, laser direct structuring with molding, etc.). Or, for example, FSS elements may comprise electrically-conductive ink (e.g., ink including silver and/or copper, etc.) that is inkjet printed (e.g., via a microjet inkjet printer, etc.) along the films or layers. As yet another example, impregnated plastic films may include portions that become electrically conductive after being struck by laser, which electrically-conductive portions define electrically-conductive FSS elements. As a further example, films or layers of a multilayered FSS structure may be impregnated with, have embedded therein, and/or printed with one or more materials to generate areas of electrical conductivity defining the pattern of FSS surfaces (e.g., rings, etc.). Other processes may also be used to provide a film or layer with FSS elements.

The films having the electrically-conductive FSS elements may be assembled (e.g., stacked, laminated, etc.) together to form the multilayer FSS structure. The FSS elements may be backed by absorber(s) to reduce the absorber frequency.

In exemplary embodiments, an FSS structure (e.g., 648 (FIG. 6), 1948 (FIG. 19), etc.) may be operable for energy blockage across one or more specific frequency(ies) or frequency range(s) while also allowing passage of one or more different specific frequency(ies) or frequency range(s). In which case, the FSS structure may be used as a single band or multiband bandpass waveguide and/or EMI mitigation structure.

In exemplary embodiments, one or more FSS elements may have a shape and/or size different than one or more other FSS elements. For example, another exemplary embodiment may include a FSS structure having FSS ring elements of varying thickness and/or varying radii.

In exemplary embodiments, the layers of a multilayered FSS structure may be any shape (e.g., rectangular, circular, triangular, etc.) and/or size, e.g., to work at multiple frequencies and/or work over a broader bandwidth, etc. In operation, an FSS structure may reflect, absorb, block, and/or redirect signals at near glancing incidence (90 degrees off normal) to stop energy.

Figures 7, 8:
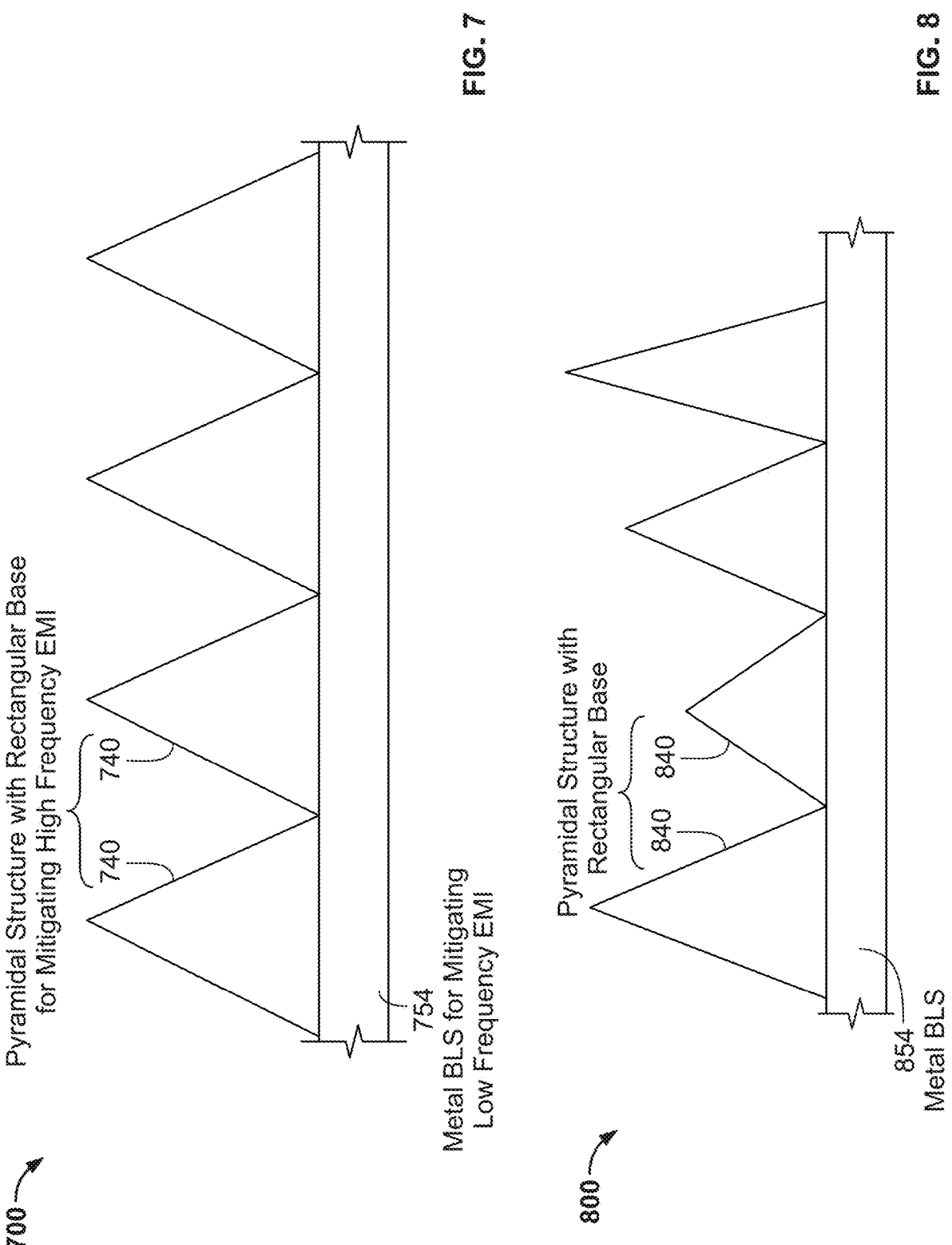
FIG. 7 illustrates pyramidal structures along a portion of a board level shield (BLS) according to an exemplary embodiment.
FIG. 8 illustrates pyramidal structures along a portion of a BLS according to an exemplary embodiment in which one or more pyramidal structures have a different size (e.g., randomized or non-randomized height different, etc.) than one or more other pyramidal structures.

FIG. 7 illustrates pyramidal structures 740 along a portion (e.g., the top, cover, lid, sidewalls, fence, frame, etc.) of a board level shield (BLS) 754 according to an exemplary embodiment 700 embodying one or more aspects of the present disclosure. In the example shown in FIG. 7, the pyramidal structures 740 are rectangular pyramids with rectangular bases. The pyramidal structures 740 may be disposed along and protrude/extend outwardly from outer surfaces(s) and/or inwardly from inner surface(s) of a top and/or sidewall(s) of the BLS (e.g., FIGS. 11, 12, and 13, etc.), etc. The pyramidal structures 740 may be configured for mitigating (e.g., absorbing, etc.) high frequency EMI. The BLS 754 may be configured (e.g., made of metal, etc.) for mitigating (e.g., blocking, etc.) low frequency EMI.

FIG. 8 illustrates pyramidal structures 840 along a portion (e.g., the top, cover, lid, sidewalls, fence, frame, etc.) of a board level shield (BLS) 854 according to an exemplary embodiment 800 embodying one or more aspects of the present disclosure. In the example shown in FIG. 8, the pyramidal structures 840 are rectangular pyramids with rectangular bases. The pyramidal structures 840 are not all the same size in this example. For example, the two inner pyramidal structures are shown with different heights, which heights are both less than the heights of the two outer pyramidal structures. The pyramidal structures 840 may be configured for mitigating (e.g., absorbing, etc.) high frequency EMI. The BLS 854 may be configured (e.g., made of metal, etc.) for mitigating (e.g., blocking, etc.) low frequency EMI.

Figures 9, 10:
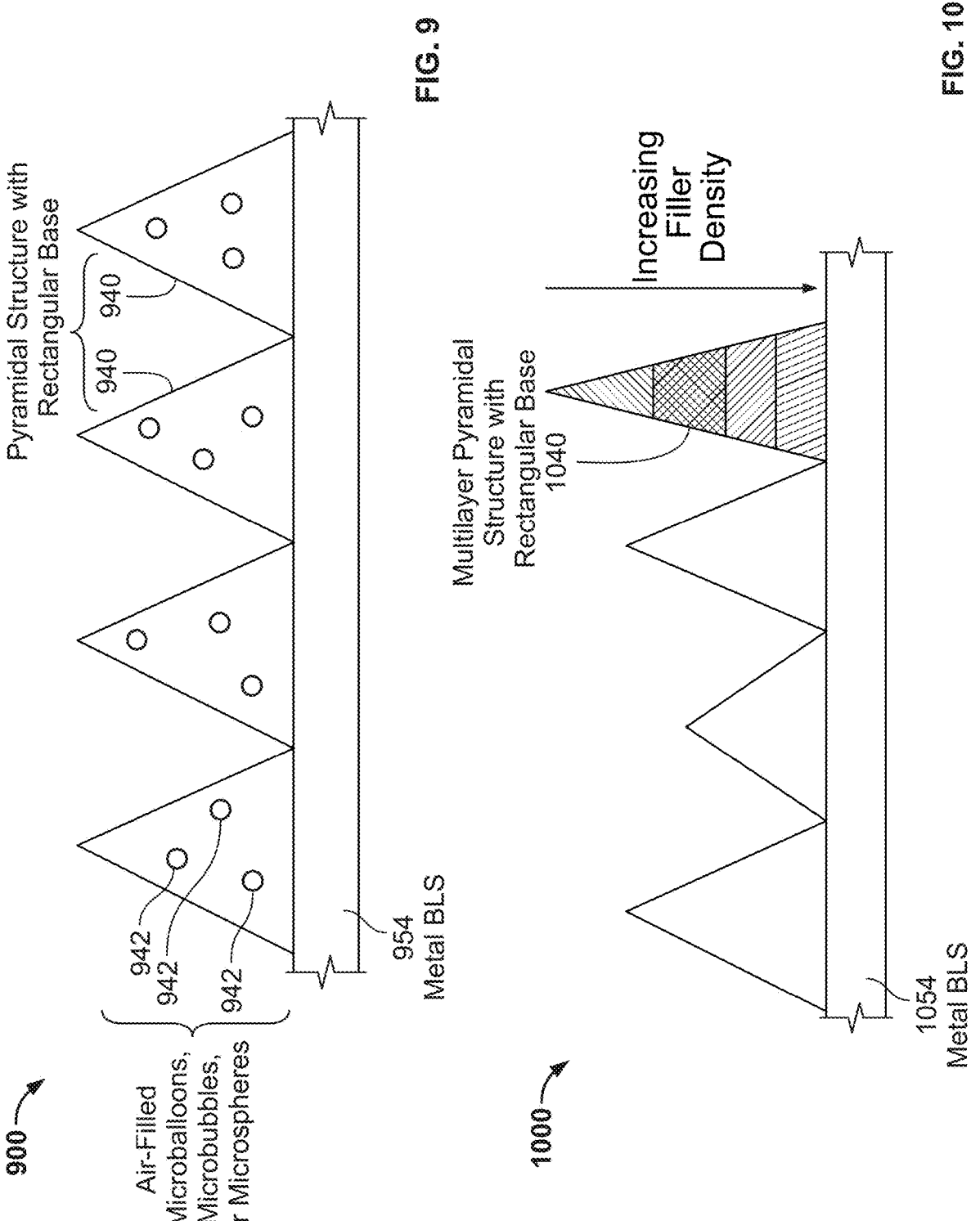
FIG. 9 illustrates pyramidal structures along a portion of a BLS according to an exemplary embodiment in which the pyramidal structures include air-filled microballoons, microspheres, or microbubbles therein, e.g., for decreasing dielectric constant of the pyramidal structures.
FIG. 10 illustrates pyramidal structures along a portion of a BLS according to an exemplary embodiment in which at least one or more of the pyramidal structures is multilayered and the filler density per layer increases in a direction from the top layer to the bottom layer.

FIG. 9 illustrates pyramidal structures 940 along a portion (e.g., the top, cover, lid, sidewalls, fence, frame, etc.) of a board level shield (BLS) 954 according to an exemplary embodiment 900 embodying one or more aspects of the present disclosure. In the example shown in FIG. 9, the pyramidal structures include air-filled microballoons, microspheres, microbubbles, 942 etc. therein. The air added by the microballoons, microspheres, or microbubbles 942 decreases the dielectric constant of the pyramidal structures 940. The pyramidal structures 940 are rectangular pyramids with rectangular bases. The pyramidal structures 940 may be configured for mitigating (e.g., absorbing, etc.) high frequency EMI. The BLS 954 may be configured (e.g., made of metal, etc.) for mitigating (e.g., blocking, etc.) low frequency EMI.

FIG. 10 illustrates pyramidal structures 1040 along a portion (e.g., the top, cover, lid, sidewalls, fence, frame, etc.) of a board level shield (BLS) 1054 according to an exemplary embodiment 1000 embodying one or more aspects of the present disclosure. In the example shown in FIG. 10, at least one or more of the pyramidal structures 1040 is multilayered. As shown in FIG. 10, the filler density per layer of the multilayered pyramidal structure 1040 increases in a direction from the top layer to the bottom layer. Accordingly, the bottom layer has the highest filler density while the top layer has the lowest filler density. Regarding the two intermediate layers between the top and bottom layers, the lower intermediate layer has a higher filler density than the upper intermediate layer. The pyramidal structures 1040 may be configured for mitigating (e.g., absorbing, etc.) high frequency EMI. The BLS 1054 may be configured (e.g., made of metal, etc.) for mitigating (e.g., blocking, etc.) low frequency EMI.

By way of example only, the multilayered pyramidal structure may have an overall height of about 2 mm or less and about 100 micron thick layers. But these dimensions are provided for purpose of illustration only as the multilayer pyramidal structure may have a different overall height and/or layers with a different thickness. In addition, the multilayered pyramidal structure 100 shown in FIG. 10 includes four layers, but other exemplary embodiments may include a multilayered pyramidal structure with more or less than four layers. Varying gradients of filler material may be used for multilayered film absorber structures (e.g., multilayered pyramidal structure 1040, etc.). Multilayered film absorber structures (e.g., multilayered pyramidal structure 1040, etc.). may have sufficient flexibility to be wrapped about at least a portion of a shield, device, etc.

Figures 11, 12:
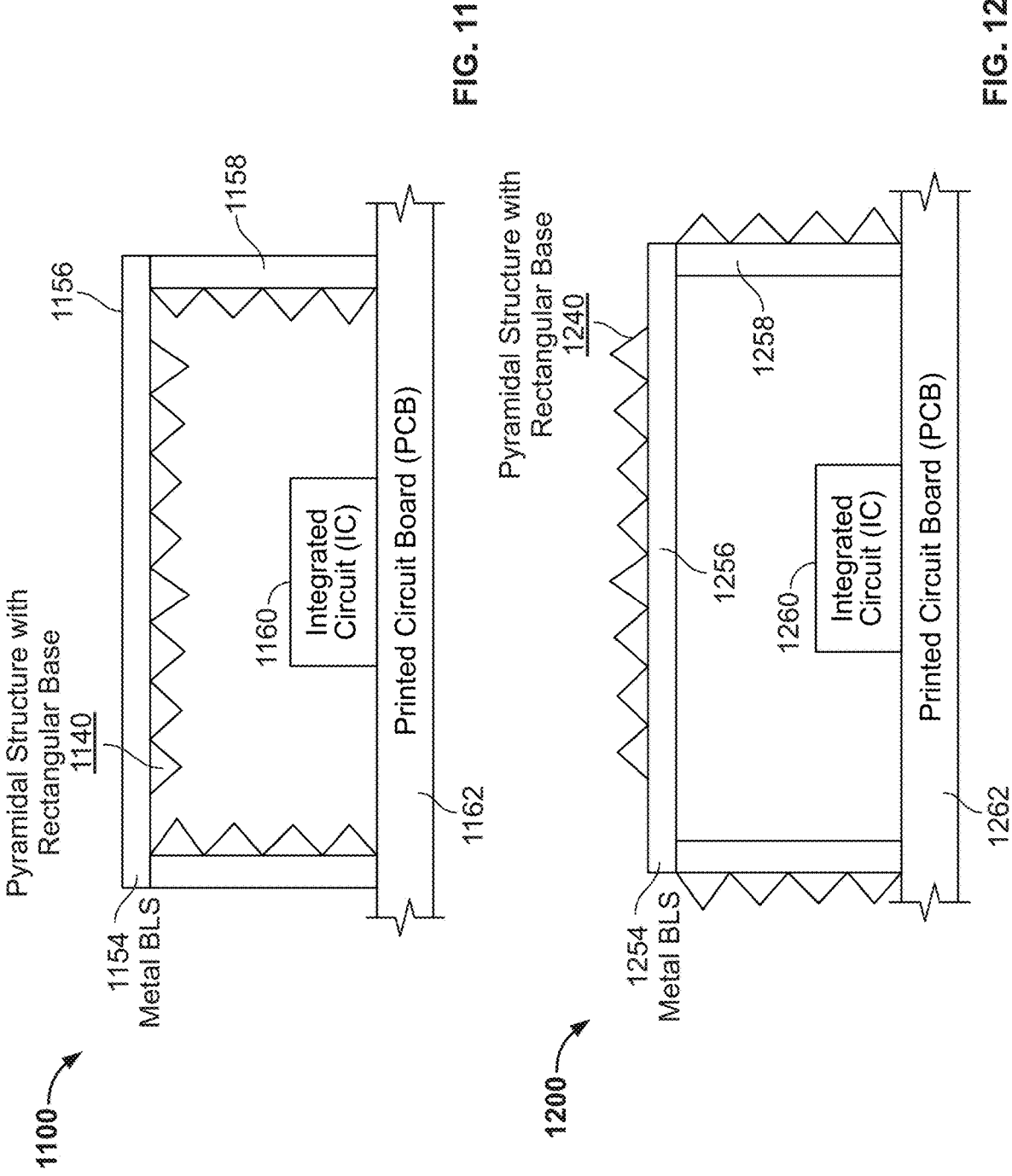
FIG. 11 illustrates a BLS and pyramidal structures along inner or interior surfaces of the BLS top and sidewalls according to an exemplary embodiment in which the pyramidal structures protrude inwardly from the BLS top and sidewalls in a direction generally towards a component on a substrate, e.g., an integrated circuit (IC) on a printed circuit board (PCB), etc.
FIG. 12 illustrates a BLS and pyramidal structures along outer or exterior surfaces of the BLS top and sidewalls according to an exemplary embodiment in which the pyramidal structures protrude outwardly from the BLS top and sidewalls in a direction generally away from the PCB component.

FIGS. 11, 12, and 13 illustrates pyramidal structures 1140, 1240, 1340, respectively, along the top and sidewalls of a board level shield (BLS) 1154, 1254, 1354 according to exemplary embodiments 1100, 1200, 1300 embodying one or more aspects of the present disclosure. The BLS is installed generally over an integrated circuit (IC) (broadly, a component or heat source) on a PCB (broadly, a substrate). The pyramidal structures may be configured for mitigating (e.g., absorbing, etc.) high frequency EMI. The BLS may be configured (e.g., made of metal, etc.) for mitigating (e.g., blocking, etc.) low frequency EMI.

In the exemplary embodiment 1100 illustrated in FIG. 11, pyramidal structures 1140 are shown protruding inwardly from the inner surfaces of the BLS top 1156 and BLS sidewalls 1158 in a direction generally towards the integrated circuit 1160 on the PCB 1162.

In the exemplary embodiment 1200 illustrated in FIG. 12, pyramidal structures 1240 are shown protruding outwardly from the outer surfaces of the BLS top 1256 and BLS sidewalls 1258 in a direction generally away from the integrated circuit 1260 on the PCB 1262.

In the exemplary embodiment 1300 illustrated in FIG. 13, pyramidal structures 1340 are shown along both the inner and outer surfaces of the BLS top 1356 and BLS sidewalls 1358, such that pyramidal structures 1340 protrude inwardly and outwardly in opposite directions relative to the BLS 1354 and integrated circuit 1360 on the PCB 1362

FIG. 14 illustrates a pyramidal structure 1440 and non-pyramidal structures 1464 along a portion (e.g., the top, cover, lid, sidewalls, fence, frame, etc.) of a board level shield (BLS) 1454 according to an exemplary embodiment 1400 embodying one or more aspects of the present disclosure. The pyramidal and non-pyramidal structures 1440, 1464 may be configured for mitigating (e.g., absorbing, etc.) high frequency EMI. The BLS 1454 may be configured (e.g., made of metal, etc.) for mitigating (e.g., blocking, etc.) low frequency EMI. As shown in FIG. 14, the non-pyramidal structures 1464 have varying slopes or tapers along their sides.

FIG. 15 illustrates structures 1564 along a portion (e.g., the top, cover, lid, sidewalls, fence, frame, etc.) of a board level shield (BLS) 1554 according to an exemplary embodiment 1500 embodying one or more aspects of the present disclosure. The structures 1564 may be configured for mitigating (e.g., absorbing, etc.) high frequency EMI. The BLS 1554 may be configured (e.g., made of metal, etc.) for mitigating (e.g., blocking, etc.) low frequency EMI.

As shown in FIG. 15, each overall structure 1564 is generally upright and extends generally perpendicular to the portion of the BLS 1554. Each structure 1564 includes pyramids 1566 along both sides, which pyramids 1566 extend generally outwardly from the structure 1564 in a direction generally parallel with the BLS portion 1554. By having the pyramids 1566 along both sides of the structures 1564, the double sided structures 1564 shown in FIG. 15 may have improved deflection and reduced contact resistance.

In exemplary embodiments, EMI absorbing protruding structures (e.g., FIGS. 5-15 and 21, etc.) may be disposed along (e.g., adhered to, etc.) one or more exposed and/or flat surfaces. In such embodiments, an inert nonfunctional material (e.g., a protective coating, etc.) may be applied over (e.g., coated onto, etc.) the EMI absorbing protruding structures. The inert nonfunctional material may be configured to protect the EMI absorbing protruding structures from deformation (and loss of performance) and/or allow the EMI absorbing protruding structures to be pressed onto a surface, without interfering with (e.g., without appreciably degrading, etc.) functionality or performance of the EMI absorbing protruding structures.

An exemplary embodiment includes a method of adhering EMI absorbing protruding structures to a surface. In this exemplary embodiment, the method may include applying a protective coating over the three-dimensional shapes of the EMI absorbing protruding structures. The method may further include applying a compressive force against the protective coating to ensure high bonding strength (or PSA adhesion) to a surface. The protective coating may be removable and/or inert (e.g., dielectric, non-absorptive, etc.).

Also disclosed herein are exemplary embodiments of device components that include (e.g., integrally include, are made out of, etc.) multilayer film structures, patterned materials, metamaterials, and/or functional films. In exemplary embodiments, a multilayer film structure, patterned material, metamaterial, and/or functional film may be incorporated within and/or be used as a device component, such as an exterior case, a back cover, a mid-plate, a screenplate, an inner plate, an exterior skin of a device, an interposer, IC packaging, etc. In such embodiments, the device component may retain its original functionality but also have an additional functionality (e.g., EMI mitigation, thermal management, dielectric, magnetic, and/or structural, etc.) provided by the multilayer film structure, patterned material, metamaterial, and/or functional film. By way of example, a multilayer film structure, patterned material, metamaterial, and/or functional film may be incorporated within and/or may be used as the case or the exterior skin of a device, such as a smartphone, gaming system console, smartwatch, 5G antenna in package (AIP), etc.

In exemplary embodiments, a multilayer film structure, patterned material, metamaterial, and/or functional film may be used for transferring heat from one or more hotter portions or areas of a device (e.g., PCB components, etc.) to one or more cooler portions or areas (e.g., other PCB components, unused portion of the PCB, etc.). By considering a device as a whole for thermal management purposes instead of treating each individual component separately and transferring heat on a single component-by-component basis, exemplary embodiments may allow for more uniform device temperature and improved device thermal properties even though individual ones of the components may be heated by transferring heat from other components. Accordingly, exemplary embodiments may include using other parts of an electronic device as heat sinks such that heat is transferred from one component(s) to another component(s) or unused portion of the PCB. For example, an inner plate of an electronic device may comprise a multilayer film structure, patterned material, metamaterial, and/or functional film that is used to provide thermal management. The multilayer film structure, patterned material, metamaterial, and/or functional film of the inner plate may draw waste heat from one or more areas and transfer/spread the waste heat to one or more other areas, which may heat and increase the temperature of these one or more other areas of the electronic device. This, in turn, may make the device temperature more uniform and allow heat to be dissipated more uniformly.

Figure 16:
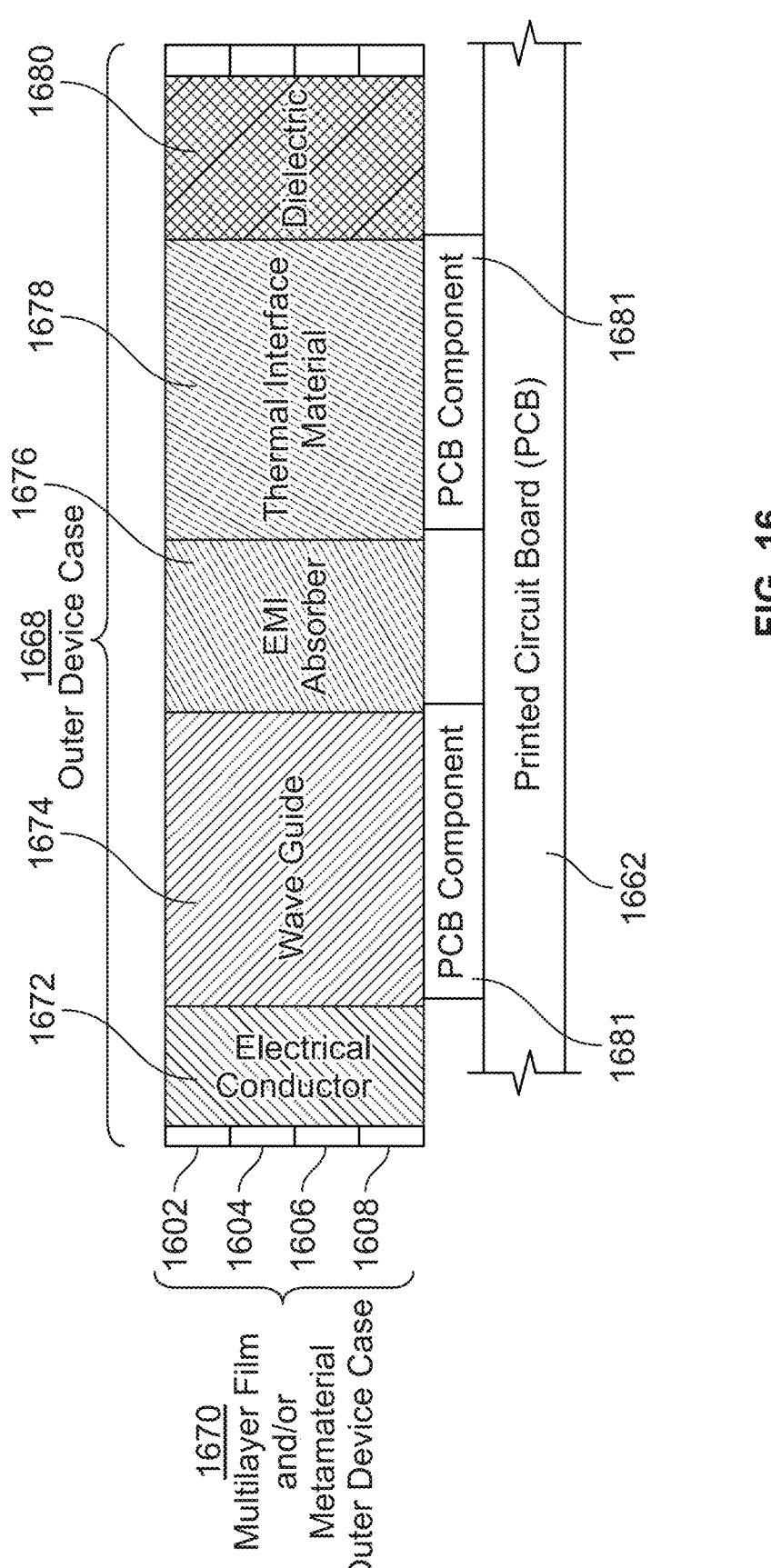
FIG. 16 illustrates an outer device case comprising a multilayer film and/or metamaterial configured to provide one or more of an electrical conductor, a wave guide, an EMI absorber, a thermal interface material (TIM), and a dielectric according to an exemplary embodiment.

FIG. 16 illustrates an outer device case 1668 comprising a multilayer film structure (e.g., a four layer film structure, etc.) and/or metamaterial 1670 according to an exemplary embodiment 1600 embodying one or more aspects of the present disclosure. In the exemplary embodiment 1600 shown in FIG. 16, the outer device case 1668 includes four layers 1602, 1604, 1606, 1608 that may be configured to provide one or more of an electrical conductor 1672, a wave guide 1674, an EMI absorber 1676, a thermal interface material (TIM) 1678, and a dielectric 1680.

The waveguide 1674 provided by the multilayer film structure and/or metamaterial 1670 may be operable for guiding waves from a PCB component 1681 on a PCB 1662. The thermal interface material 1678 provided by the multilayer film structure and/or metamaterial 1670 may be operable for establishing a thermally-conductive heat path from a PCB component 1682 to an exterior of the outer device case 1668.

The multilayer film structure and/or metamaterial 1670 may be configured to allow desired signals to pass therethrough (e.g., bandpass, etc.) while rejecting and preventing passage of other undesired signals (e.g., bandstop, etc.) at the enclosure or outer device level. The multilayer film structure and/or metamaterial 1670 may be used for mitigating EMI via directional signal steering in the outer device case 1668.

The outer device case 16668 may also or alternatively include an FSS structure (e.g., 648 (FIG. 6), 1948 (FIG. 19), etc.) within or along a portion of the outer device case 1668. For example, electrically-conductive metamaterial in a pattern may be disposed along an inner surface of the outer device case 1668.

Accordingly, exemplary embodiments disclosed herein may include an outer device case 1668 that is multifunctional in that the outer device case 1668 retains its original functionality as an outer device case 1668. But the outer device case 1668 also includes additional functionality, such as the functionality associated with the wave guide 1674 and thermal interface material 1678 provided by the multilayer film structure and/or metamaterial 1670. In the illustrated embodiment shown in FIG. 16, the outer device case 1668 includes four layers 1602, 1604, 1606, 1608, but other exemplary embodiments may include an outer device case with more or less than four layers.

Figure 17:
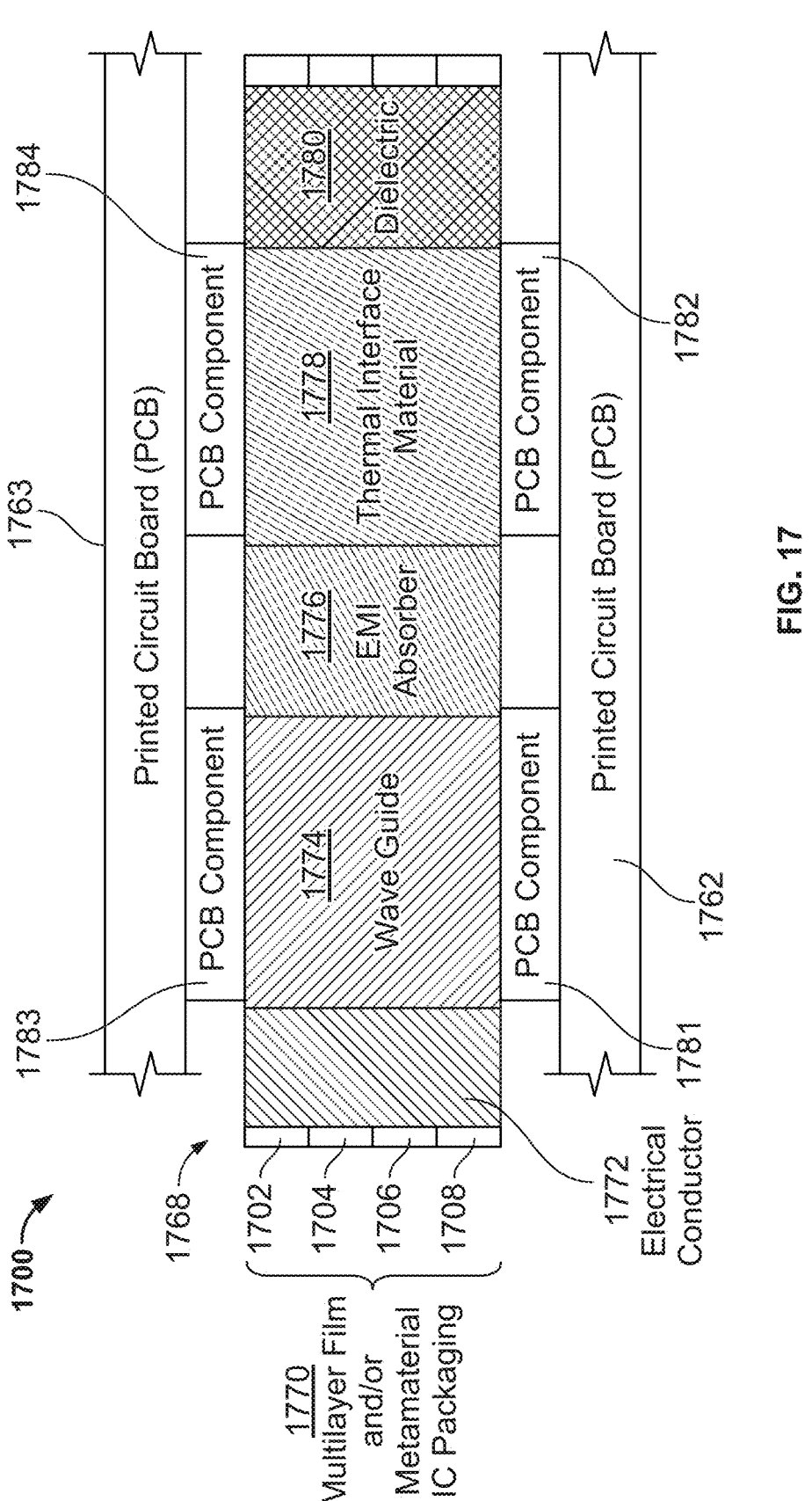
FIG. 17 illustrates an interposer comprising a multilayer film and/or metamaterial configured to provide one or more of an electrical conductor, a wave guide, an EMI absorber, a thermal interface material (TIM), and a dielectric between two PCBs according to an exemplary embodiment.

FIG. 17 illustrates an interposer 1768 comprising a multilayer film structure (e.g., a four-layer film structure, etc.) and/or metamaterial 1770 according to an exemplary embodiment 1700 embodying one or more aspects of the present disclosure. In the exemplary embodiment 1700 shown in FIG. 17, the multilayer film structure and/or metamaterial interposer 1770 is positioned or sandwiched between two PCBs 1762 and 1763.

The multilayer film structure and/or metamaterial interposer 1770 may be configured to provide one or more of an electrical conductor 1772, a wave guide 1774, an EMI absorber 1776, a thermal interface material (TIM) 1778, and a dielectric 1780 interposed between the two lower and upper PCBs 1762, 1763. The multilayer film structure and/or metamaterial interposer 1770 may be a selectively functional structure, e.g., to connect the two PCBs in a sandwich, making electrical interconnections, providing EMI shielding, and/or providing thermally-conductive pathways, etc. The multilayer film structure and/or metamaterial interposer 1770 may include a portion with a relatively high dielectric constant, such that the two PCBs 1762, 1763 are capacitively coupled via the interposer portion having the high dielectric constant.

In an exemplary embodiment, an interposer is provided for connecting two PCBs or SIPs with components via molding (e.g., injection molding, etc.) of functional block copolymer with electrical connection traces between the SIPs. In the exemplary embodiment shown in FIG. 17, the interposer 1768 includes four layers 1702, 1704, 1706, 1708, but other exemplary embodiments may include an interposer with more or less than four layers.

The interposer 1768 may be configured to allow interconnection as needed between PCBs 1762, 1763 while also having loaded EMI properties. The interposer 1762, 1763 may be positionable between two PCBs 1762, 1763 each including at least one component 1781, 1782, 1783, 1784 thereon. The interposer 1768 may comprise block copolymer of at least two polymers and one or more fillers as disclosed herein. The interposer 1768 may include at least one electrical trace passing through the interposer 1768 to provide at least one electrical connection between at least one component on one circuit board with at least one component on the other circuit board. For example, the interposer 1768 shown in FIG. 17 may provide an electrical connection between the PCB component 1781, 1782 on the lower PCB 1762 with the corresponding PCB component 1783, 1784 on the upper PCB 1763.

Exemplary embodiments may include patterning of functionality in a multilayered film structure to match a layout of components on two or more PCBs. When the PCBs are sandwiched together, the patterned multilayer film structure may provide electrical interconnections and other functionality between components on the PCBs. In exemplary embodiments, patternized films may be created for providing electrical interconnections for SIPs (system in package). In exemplary embodiments, a multilayered film structure comprising block copolymer films may be used as a substrate material for a PCB.

Figure 18:
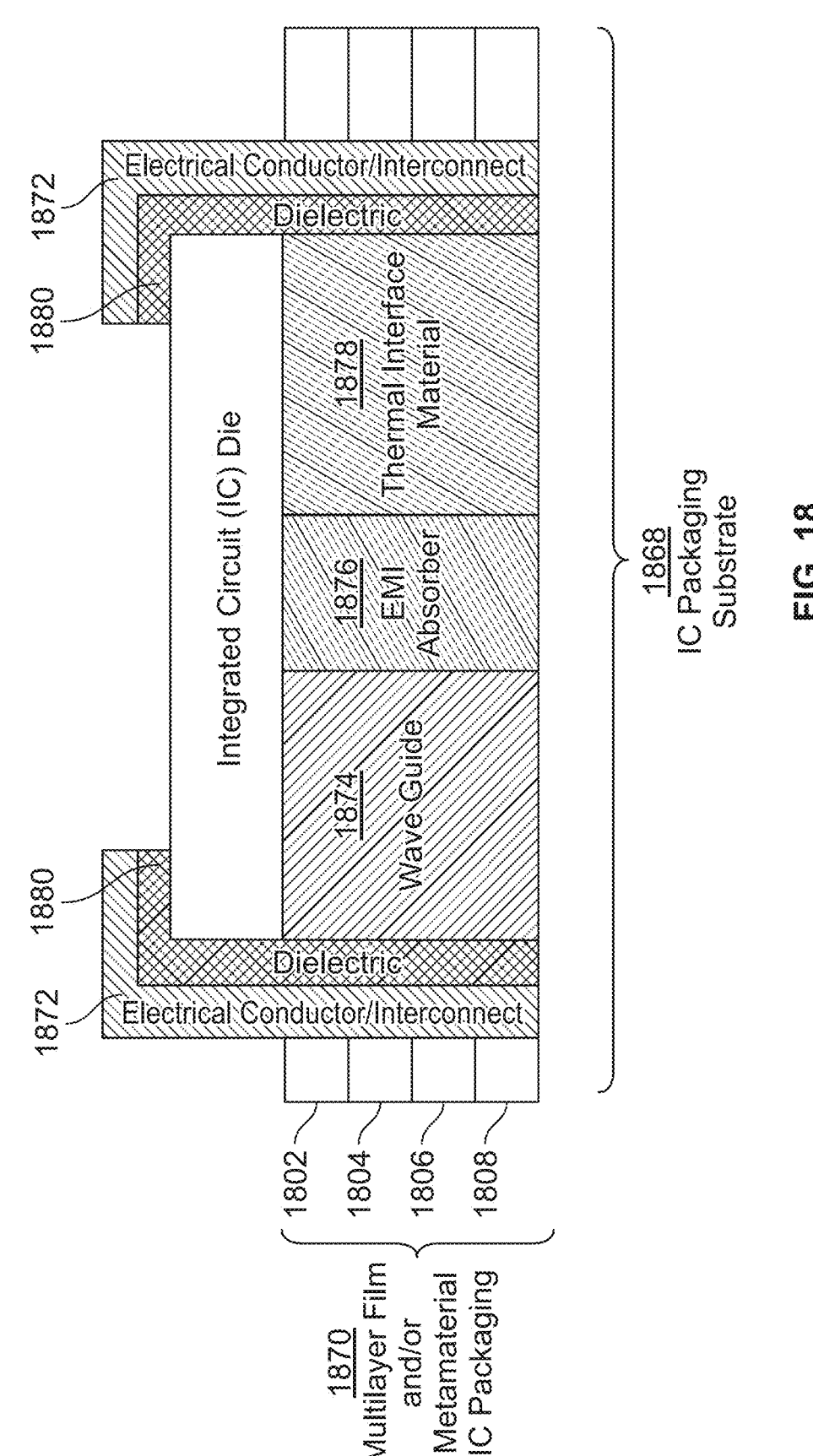
FIG. 18 illustrates integrated circuit (IC) packaging comprising a multilayer film and/or metamaterial configured to provide one or more of an electrical conductor/interconnect, a wave guide, an EMI absorber, a thermal interface material (TIM), and a dielectric according to an exemplary embodiment.

FIG. 18 illustrates integrated circuit (IC) packaging 1868 comprising a multilayer film structure and/or metamaterial 1870 according to an exemplary embodiment 1800 embodying one or more aspects of the present disclosure. As shown in FIG. 18, the multilayer film structure and/or metamaterial 1870 may be configured to provide one or more of an electrical conductor/interconnect 1872, a wave guide 1874, an EMI absorber 1876, a thermal interface material (TIM) 1878, and a dielectric 1880.

The multilayer film structure and/or metamaterial 1870 may be configured to steer energy or electromagnetic radiation, etc. The multilayer film structure and/or metamaterial IC packaging may be a selectively functional structure, e.g., part EMI shield, part TIM, part EMI absorber, part wave guide, and/or part electrical connector, etc. The multilayer film structure and/or metamaterial 1870 may be configured to provide a 3D structure including interconnects that are waveguide or coaxial structures and/or vertical and multilevel, etc. In the illustrated embodiment shown in FIG. 18, the IC packaging 1868 includes four layers 1802, 1804, 1806, 1808, but other exemplary embodiments may include IC packaging with more or less than four layers.

Figure 20:
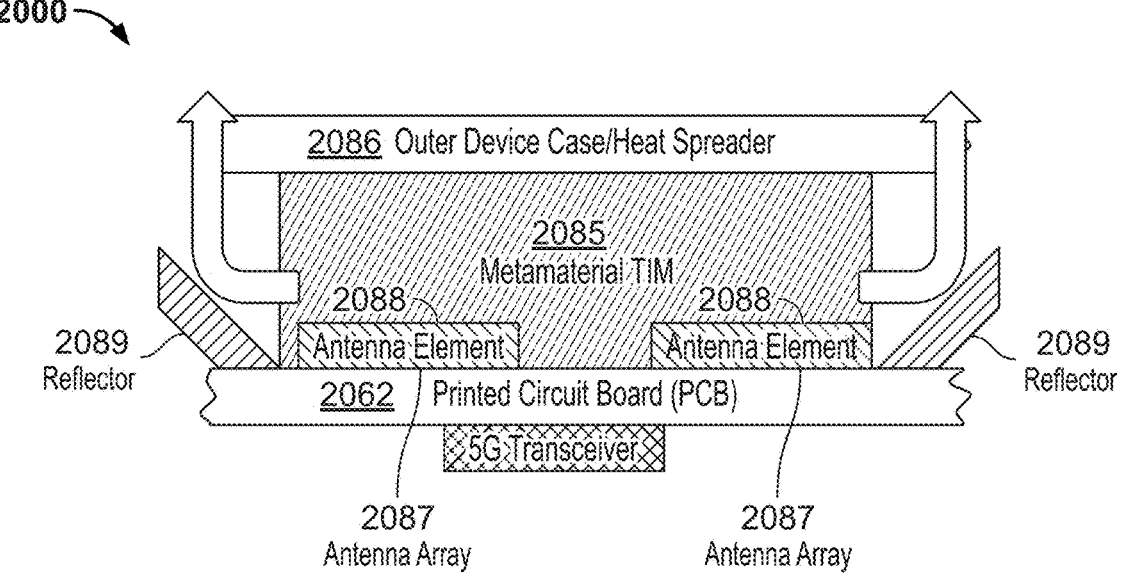
FIG. 20 illustrates a metamaterial TIM configured to be operable for providing a thermally-conductive heat path and for directing millimeter-wave signals generally towards reflectors according to an exemplary embodiment.

FIG. 20 illustrates a metamaterial TIM positioned 2085 within a device (e.g., smartphone, etc.) according to an exemplary embodiment 2000 embodying one or more aspects of the present disclosure. As shown in FIG. 20, the metamaterial TIM 2085 is positioned between (e.g., compressively sandwiched between, etc.) an outer device case/heat spreader 2086 and a PCB 2062 including an array 2087 of antenna elements 2088. In this exemplary embodiment, the metamaterial TIM 2085 is configured to be operable for providing a thermally-conductive heat path generally between the PCB 2062 and the outer device case/heat spreader 2086. As represented by the arrows, the metamaterial TIM 2085 is also configured to be operable for directing or steering signals (e.g., millimeter-wave signals, etc.) from the antenna elements 2088 towards the reflectors 2089. The reflectors 2089 may then reflect the signals upwards thereby avoiding issues of high dielectric constant impact on antenna performance.

Metamaterial patterning (e.g., FSS, etc.) may be used in a device case or housing for directing signals for reducing EMI and for eliminating or reducing side lobes. By way of example, a metamaterial FSS may be used inside a radome, which may allow for a reduction in radome thickness, e.g., from about 3 millimeters to ½ millimeter, etc.

Figure 21B:
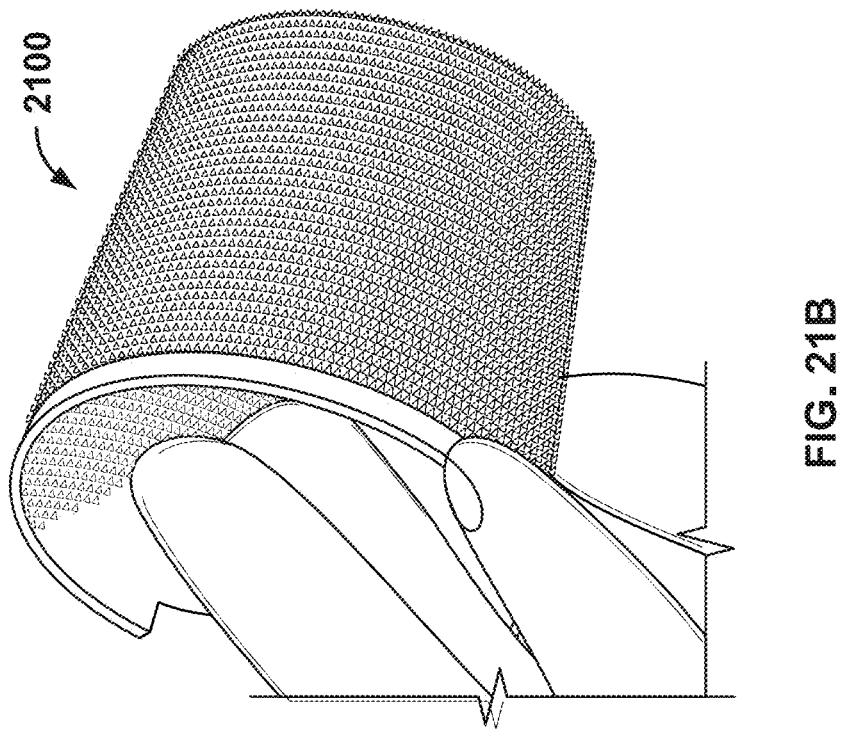
FIGS. 21a and 21b illustrate an example flexible material including filled dielectric pyramidal structures that may be made by the process shown in FIGS. 2A-2E according to an exemplary embodiment.
Figure 21A:
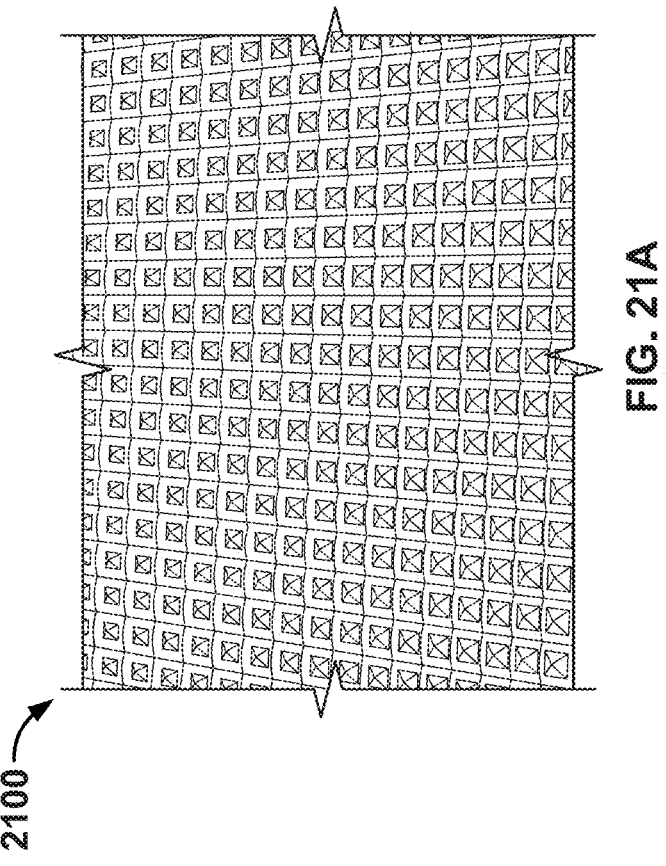

FIGS. 21a and 21b illustrate an example flexible material 2100 including filled dielectric pyramidal structures that may be made by the process shown in FIGS. 2A-2E according to an exemplary embodiment embodying one or more aspects of the present disclosure. The filled dielectric may comprise polydimethylsiloxane (PDMS) filled with carbon black, a filled block copolymer system, a filled elastomeric system, a filled thermoplastic system, etc. The pyramidal structures may comprise rectangular pyramids configured to be operable for EMI mitigation as disclosed herein.

As demonstrated by FIG. 21b, the material 2100 having the filled dielectric pyramidal structures may be sufficiently flexible and conformal to be wrapped around a component, device, etc. Accordingly, the flexible material 2100 may comprise a functional (e.g., EMI mitigation, etc.) wrap, which may be wrapped around at least a portion (e.g., wrapped around both sides, etc.) of a PCB.

Conventional board level shields operate to contain EMI energy by creating an electrically-conductive metal Faraday Cage around a device component(s). The metal shield often serves to also contain thermal energy thereunder, which thermal energy must be released causing EMI reduction and thermal transfer to operate at cross purposes. Traditional board level shields have a rectangular construction of electrically-conductive metal with five sides. The sixth side of the Faraday shield is provided by the ground plane of the PCB.

In exemplary embodiments disclosed herein, one (or more) metal sidewalls of a BLS is replaced by absorber material. By way of example, the absorber material may comprise one or more multilayer film structures and/or patterned materials disclosed herein, such as multilayer film structure comprising block copolymer films with domains (e.g., FIGS. 3 and 4, etc.), an FSS structure including FSS elements (e.g., FIGS. 6 and 19, etc.), a material having pyramidal and/or non-pyramidal structures (e.g., FIGS. 1, 2, 5-15, and 21, etc.), etc.

By controlling the absorber thickness and placement, a high impedance wall may be created that will block or prevent electromagnetic energy from passing through the absorber. This may, in general, be frequency specific. The absorber material may comprise a thermally-conductive absorber material to facilitate thermal transfer in a hybrid EMI/thermal device.

In exemplary embodiments, one or more BLS sidewalls may be made of absorber material configured for directing or steering different frequencies in different directions, such that some frequencies may be attenuated while the remaining frequencies may not be attenuated.

Figure 22:
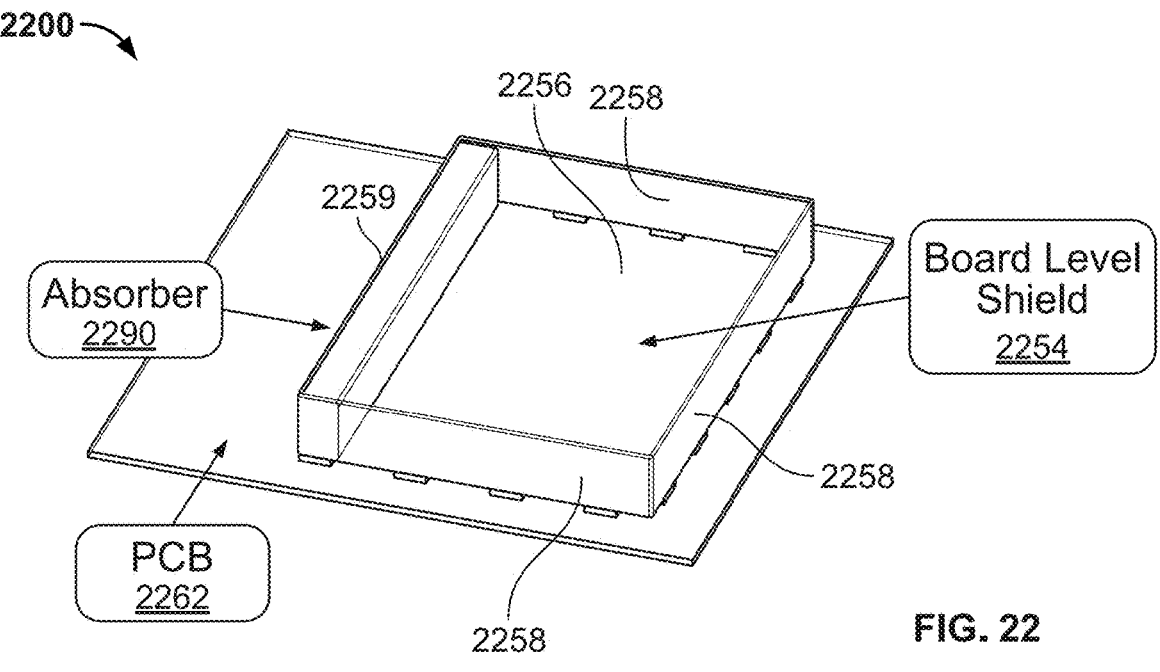
FIG. 22 is a perspective view of a board level shield (BLS) according to an exemplary embodiment in which one sidewall of the BLS is made of EMI absorbing material or absorber.

FIG. 22 illustrates a board level shield (BLS) 2254 according to an exemplary embodiment 2200 embodying one or more aspects of the present disclosure. The BLS 2254 includes a top 2256 and four sidewalls. The BLS top 2256 and three sidewalls 2258 are made of electrically-conductive metal (e.g., sheet metal, etc.). The fourth sidewall 2259 is made of an absorber material 2290 instead of the electrically-conductive metal used for the BLS top 2256 and three other sidewalls 2258.

The fourth sidewall 2259 may be made of a thermally-conductive absorber material 2290, such that the fourth sidewall is thermally conductive. In which case, the fourth sidewall 2259 may be operable for absorbing EMI while also allowing thermal heat transfer. The sidewalls 2258 and 2259 may be configured (e.g., include mounting feet, etc.) for installation (e.g., soldering, etc.) to a PCT 2262 or other substrate.

Figure 23:
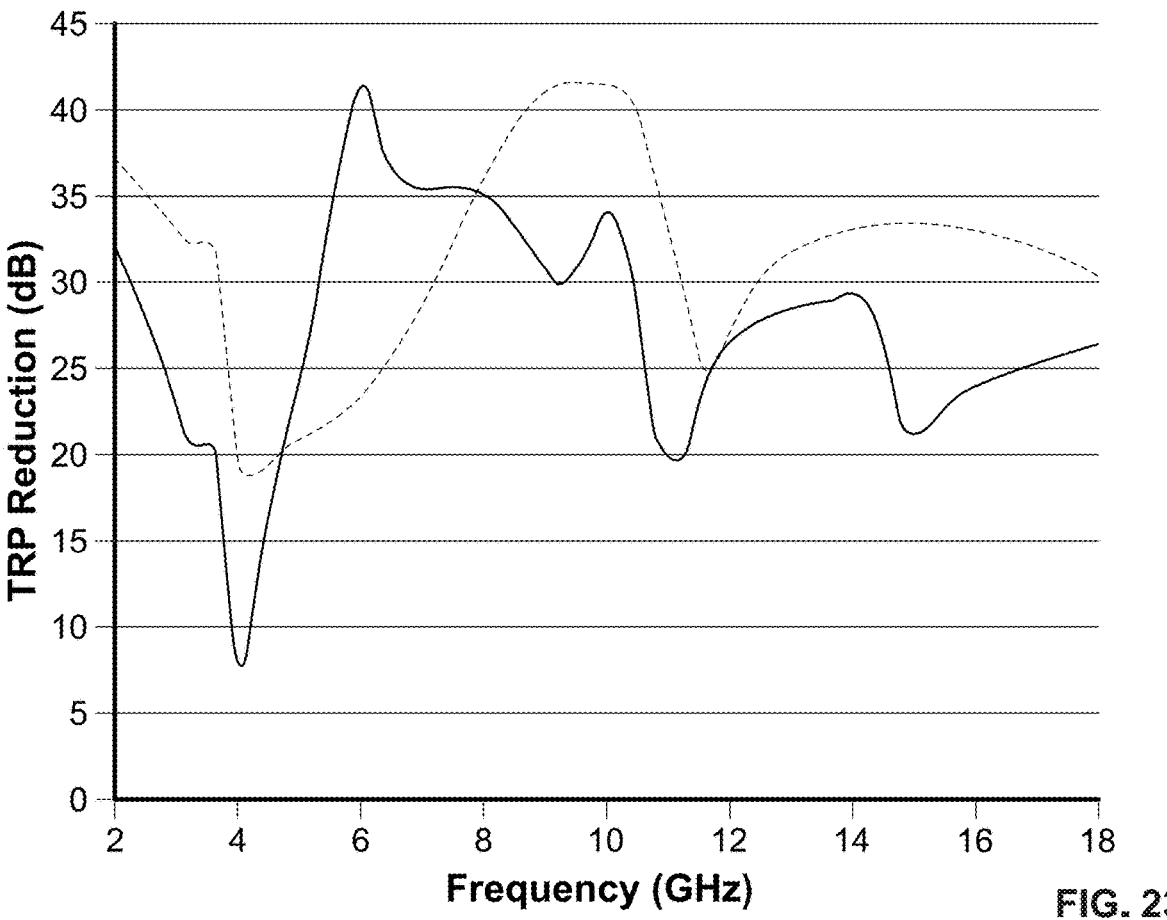
FIG. 23 is a line graph showing simulated reduction in total radiated power in decibels (dB) versus frequency in gigahertz (GHz) for the board level shield in FIG. 22, where the location of the absorber differs in two cases with shift in frequency of maximum total radiated power reduction.

FIG. 23 is a line graph showing simulated reduction in total radiated power in decibels (dB) versus frequency in gigahertz (GHz) for the board level shield in FIG. 22, where the location of the absorber differs in two cases with shift in frequency of maximum total radiated power reduction.

Exemplary embodiments may include laser curing dopant catalyst (e.g., specks, etc.) within a film to cause the dopant to crystallize and thereby provide enhanced performance, e.g., thermal management, electromagnetic interference (EMI) mitigation, electrical conductivity, thermal conductivity, EMI absorbing, magnetic, dielectric, and/or structural performance, etc. Other exemplary embodiments may include tape casting by ink jet printing material into openings (e.g., perforations, cutouts, holes, etc.) in films to provide electrical interconnections and/or thermal pathways.

Exemplary embodiments may include methods of using at least one of a shape (e.g., sheet, other extension or projection, etc.), one or more domains of a multilayer block copolymer film structure, doping and/or patterning for providing EMI mitigation (e.g., EMI shielding, EMI absorption, etc.) and/or thermal management. The shape may comprise a pyramidal structure (e.g., rectangular pyramid, etc.) and/or a non-pyramidal structure.

In an exemplary embodiment, a method of making a multilayer thermal management and/or electromagnetic interference (EMI) mitigation materials may include creating block copolymer films with domains by adding one or more fillers or additives to change one or more properties, characteristics, functions, and/or performance of the domains, e.g., thermal management, electromagnetic interference (EMI) mitigation, electrical conductivity, thermal conductivity, EMI absorbing, magnetic, dielectric, and/or structural performance, etc.

In an exemplary embodiment, a method for manufacturing film may include determining a pattern of functionality, selecting a first polymer with first properties, selecting a second polymer with second properties, selecting a functional material (e.g., predefined, in a predetermined form, etc.) with third properties (e.g., thermally-conductive, electrically-conductive, EMI absorbing, dielectric, structural, etc.), and using the first and second polymers and the functional material to make films via block copolymer process such that the films have the pattern of functionality when assembled together (e.g., stacked and laminated into a multilayer structure, etc.). The pattern of functionality may include height of columns, width of columns, spacing of columns, loadability of filler, and/or density of filler in columns, etc.

In an exemplary embodiment, a multilayer structure includes a base layer including (e.g. molded with, etc.) structures (e.g., pyramidal structures, non-pyramidal structures, etc.) protruding therefrom along at least a first side of the base layer. A planarization layer is along the first side, which provides a substantially planar surface opposite a second side of base layer.

The planarization layer may comprise a dielectric material (e.g., graded dielectric for impedance matching, a uniform dielectric planarization layer, etc.), a thermally-conductive material, an electrically-conductive material, etc. At least one film layer may be disposed along (e.g., adhered to, etc.) the planarization layer opposite the base layer.

The multilayer structure may include frequency selective surface (FSS) elements (e.g., electrically-conductive rings, etc.) disposed generally between the film layer and the planarization layer. For example, the FSS elements may comprise electrically-conductive rings in a pattern. The multilayer structure may include multiple FSS layers or films (e.g., in a stacked arrangement, etc.) including FSS elements, e.g., electrically-conductive rings printed along or embedded within multiple layers or films. The FSS elements of one layer may overlap FSS elements in another layer. The FSS elements may include a base layer comprising EMI absorbing material.

In exemplary embodiments, areas of heightened or lessened magnetic properties may be created within a multilayered film structure and/or patterned material. For example, regions of magnetic attraction and repulsion may be used when loaded copolymer resin is polymerizing into film during extrusion or calenderization.

In exemplary embodiments in which a thermal interface material may be applied to and/or used along with a multilayer film structure and/or patterned material, a wide range of thermal interface materials may be used. Example thermal interface materials include thermal gap fillers, thermal phase change materials, thermally-conductive EMI absorbers or hybrid thermal/EMI absorbers, thermal greases, thermal pastes, thermal putties, dispensable thermal interface materials, thermal pads, etc.

In exemplary embodiments that include or involve a board level shield, a wide range of materials may be used for the board level shield (broadly, shield) or portion thereof, such as cold rolled steel, nickel-silver alloys, copper-nickel alloys, stainless steel, tin-plated cold rolled steel, tin-plated copper alloys, carbon steel, brass, copper, aluminum, copper-beryllium alloys, phosphor bronze, steel, alloys thereof, a plastic material coated with electrically-conductive material, or any other suitable electrically-conductive and/or magnetic materials. The materials disclosed in this application are provided herein for purposes of illustration only as different materials may be used depending, for example, on the particular application.

Exemplary embodiments may include a multilayer film structure and/or patterned material including at least a portion (e.g., a through thickness domain of a block copolymer film, etc.) having a high thermal conductivity (e.g., within a range from about 1 W/mK (watts per meter per Kelvin) to about 6 W/mK, etc.) depending on the particular materials used to make the multilayer film and/or patterned material and loading percentage of thermally-conductive filler, if any. These thermal conductivities are only examples as other embodiments may include a multilayer film and/or patterned material including at least one portion with a thermal conductivity higher than 6 W/mK, less than 1 W/mK, or between 1 and 6 W/mk.

In exemplary embodiments, at least a portion of a multilayer film structure and/or patterned material may be thermally conductive (e.g., a thermally-conductive domain of a block copolymer film, etc.) with a relatively high thermal conductivity. In such embodiments, the thermally-conductive portion of the multilayer film structure and/or patterned material may be used to define or provide part of a thermally-conductive heat path from a heat source to a heat removal/dissipation structure or component. The thermally-conductive portion of the multilayer film structure and/or patterned material may be used, for example, to help conduct thermal energy (e.g., heat, etc.) away from a heat source of an electronic device. The thermally-conductive portion of the multilayer film structure and/or patterned material may be positionable generally between a heat source and a heat removal/dissipation structure or component to establish a thermal joint, interface, pathway, or thermally-conductive heat path along which heat may be transferred (e.g., conducted) from the heat source to the heat removal/dissipation structure or component. During operation, the thermally-conductive portion of the multilayer film structure and/or patterned material may function to allow transfer (e.g., to conduct heat, etc.) of heat from the heat source along the thermally-conductive path to the heat removal/dissipation structure or component. In exemplary embodiments in which the multilayer film structure and/or patterned material includes at least a portion for EMI mitigation (e.g., an electrically-conductive and/or EMI absorbing domain of a block copolymer film, etc.), the multilayer film structure and/or patterned material may also be operable for mitigating EMI (e.g., absorbing, blocking, reflecting, etc.) incident upon the EMI mitigation portion of the multilayer film structure and/or patterned material.

Example embodiments disclosed herein may be used with a wide range of heat sources, electronic devices (e.g., smartphones, etc.), and/or heat removal/dissipation structures or components (e.g., a heat spreader, a heat sink, a heat pipe, a vapor chamber, a device exterior case or housing, etc.). For example, a heat source may comprise one or more heat generating components or devices (e.g., a CPU, die within underfill, semiconductor device, flip chip device, graphics processing unit (GPU), digital signal processor (DSP), multiprocessor system, integrated circuit (IC), multi-core processor, etc.). Generally, a heat source may comprise any component or device that has a higher temperature than the thermally-conductive portion of the multilayer film structure and/or patterned material or otherwise provides or transfers heat to the thermally-conductive portion of the multilayer film structure and/or patterned material regardless of whether the heat is generated by the heat source or merely transferred through or via the heat source. Accordingly, aspects of the present disclosure should not be limited to use with any single type of heat source, electronic device, heat removal/dissipation structure, etc.

In exemplary embodiments, EMI absorbing structures or EMI absorbers may be exterior to or along the outside of a cavity or chamber. The EMI absorbers or structures may be configured (e.g., shaped with cones or pyramids, etc.) to suppress or reduce the probability of reflection of incident radiation (e.g., high frequency radiation at wide angles, radiation at stray frequencies, etc.) through an aperture (e.g., an automotive radar aperture, etc.) into the cavity or chamber. The EMI absorber placement may thus allow for improved performance of electronics (e.g., ADVICS (ADVanced Intelligent Chassis Systems), etc.) inside the cavity or chamber and remove stray frequencies.

Figure 24:
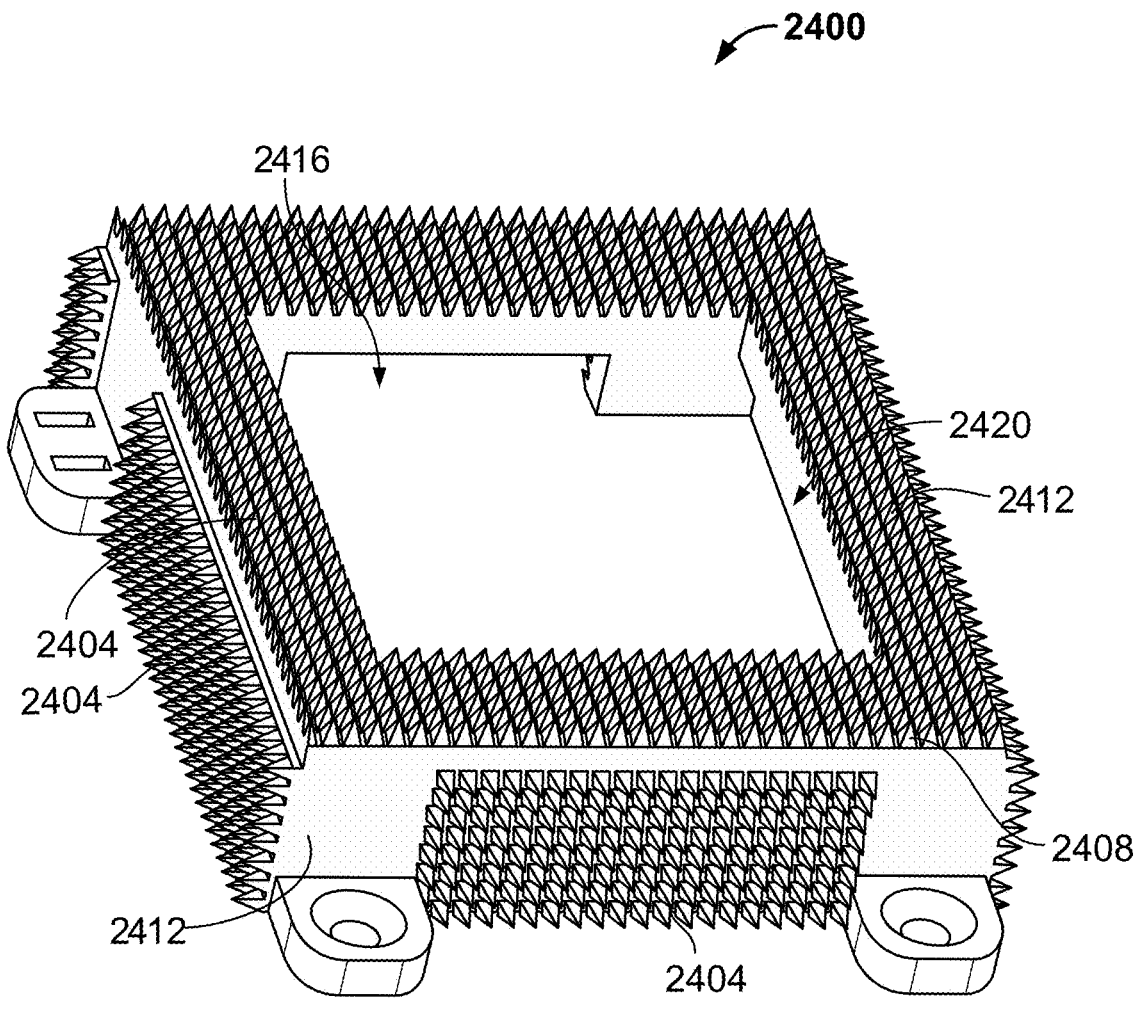
FIG. 24 illustrates EMI absorbing pyramidal structures along the outside of a device component that defines a cavity or chamber according to an exemplary embodiment.

FIG. 24 illustrates an exemplary device component 2400 and structures 2404 (e.g., EMI absorbing pyramidal structures, etc.) along the outside of the device component 2400 according to an exemplary embodiment embodying one or more aspects of the present disclosure. The structures 2404 are configured for EMI mitigation (e.g., absorbing high frequency EMI, etc.).

The structures 2404 may be disposed along (e.g., adhered to, etc.) and protrude outwardly from one or more exterior portions of the device component 2400. In this illustrated embodiment, structures 2404 are disposed along an exterior or outer surface of the device's top wall or portion 2408. Structures 2404 are also disposed along the exterior or outer surface of the device's sides or sidewalls 2412.

The device component 2400 may define an interior, cavity, or chamber 2416 and an aperture or opening 2420 (e.g., automotive radar aperture, non-automotive radar aperture, other radar aperture, etc.) into the chamber 2416. In this illustrated embodiment, the structures 2404 are disposed along and/or define the entire top surface 2408 of the device component 2400, which, in turn, defines the aperture 2420 into the chamber 2416. Accordingly, the structures 2404 are disposed around the entire perimeter of the aperture 2420. In alternative embodiments, EMI absorbing structures may also be disposed along one or more inner surfaces of the device component within the chamber 2416. In such alternative embodiments, EMI absorbing structures 2404 (e.g., pyramidal structures, etc.) may be disposed along both the inner and outer surfaces of the device component 2400, such that EMI absorbing structures protrude inwardly and outwardly in opposite directions relative to the device component 2400.

The device component 2400 may comprise an electronics housing, a board level shield (BLS), other device component, etc. The device component 2400 may be configured (e.g., made of metal, shaped, sized, etc.) for mitigating (e.g., blocking, reflecting, etc.) low frequency EMI. The structures 2404 may be configured (e.g., made of EMI absorbing materials, shaped, sized, etc.) for mitigating (e.g., absorbing, etc.) high frequency EMI.

Placement of the structures 2404 along the outside of the device component 2400 may reduce the probability that incident radiation will reflect through the aperture 2420 into the interior, chamber, or cavity 2416. The structures 2404 may be operable to suppress or inhibit the reflection of incident radiation through the aperture 2420 into the cavity or chamber 2416.

By way of example, the structures 2404 may be configured to be operable for suppressing high frequency radiation at wide angles to the aperture 2420. The placement of the EMI absorbing structures 2404 may allow for improved performance of electronics (e.g., ADVICS (ADVanced Intelligent Chassis Systems), etc.) inside the cavity or chamber 2416 and remove radiation at stray frequencies.

Figure 25:
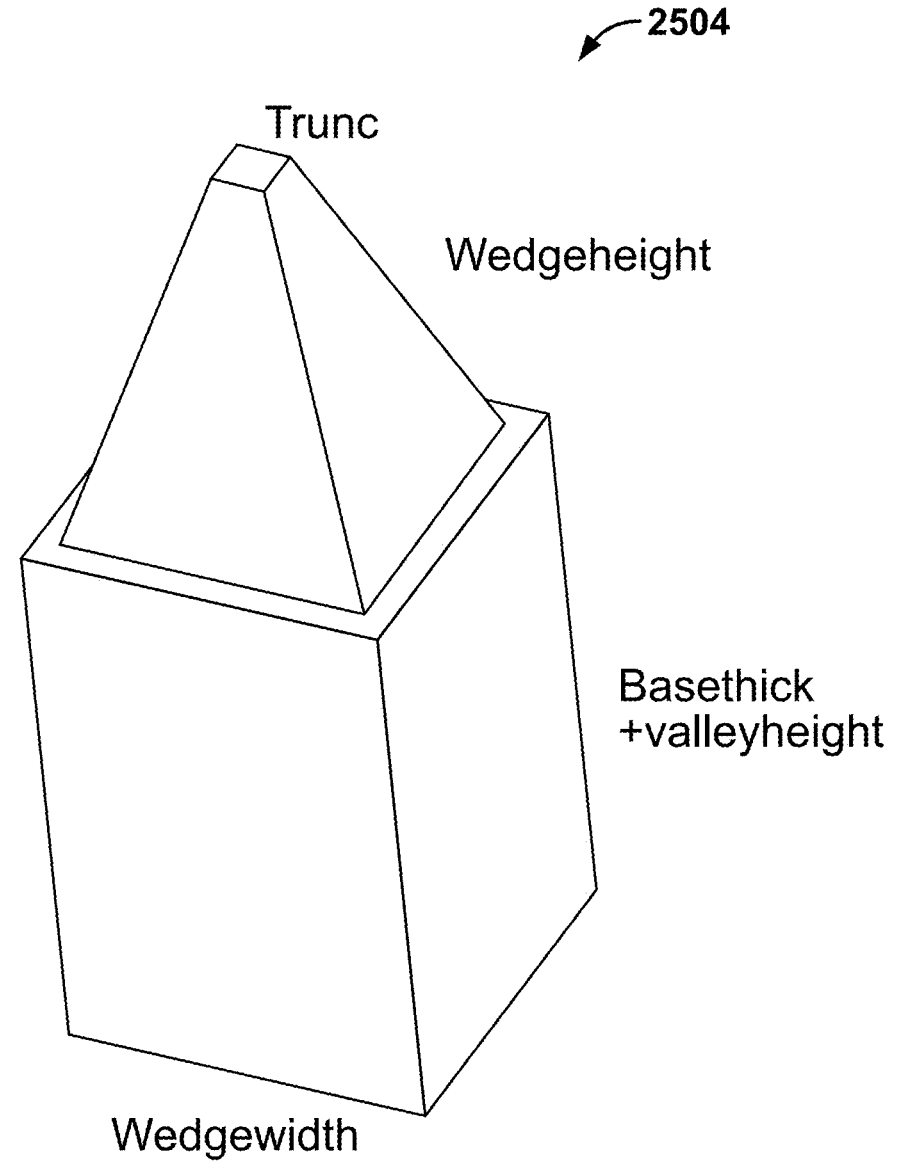
FIG. 25 illustrates a pyramidal structure for an EMI absorber according to exemplary embodiment.

The EMI absorbing structures 2404 may comprise rectangular pyramids (e.g., rectangular pyramid 2504 shown in FIG. 25, etc.). The rectangular bases of adjacent pyramids may contact each other substantially without any gaps or spaced distances between the rectangular bases. This helps avoiding reflectivity that might otherwise occur if there were gaps between the rectangular bases of the pyramidal structures. Other exemplary embodiments may include non-pyramidal structures that taper or decrease (e.g., curve generally smoothly, etc.) in width from the top (e.g., from a point, etc.) towards the base. Alternative exemplary embodiments may include structures having non-rectangular bases, e.g., hexagonal bases, triangular bases, etc. Accordingly, the present disclosure should not be limited to only rectangular pyramidal structures as other exemplary embodiments may include structures having different three-dimensional geometric shapes.

In exemplary embodiments, the sides of the structures 2404 may not be perfectly smooth or define a perfectly straight line from top to bottom. For example, the sides may appear to have a stepped configuration when viewed at high magnification. But the sides of the pyramidal or non-pyramidal structures may preferably be relatively smooth (e.g., without any significantly sized steps, etc.) to reduce or avoid reflection of EMI incident on the structures. In addition, the structures may be configured to have a varying slope or taper (e.g., at least two or more slopes, etc.) along the sides. For example, a pyramidal structure may have a relatively gradual taper from the base towards a middle portion, a quicker taper from the middle portion towards the top, and then less taper therefrom to the top of the structure.

The structures 2404, 2504 may comprise a filled dielectric, such as polydimethylsiloxne (PDMS) filled with carbon black, another filled block copolymer system, a filled elastomeric system, a filled thermoplastic system, injection moldable resin filled with carbon nanotubes, polymer resin filled with carbon nanotubes, etc. Alternatively, the structures 2404, 2504 may be made of other materials and/or by other suitable processes (e.g., a stepwise deposition of material onto a functional carrier film, etc.).

In exemplary embodiments, the configuration (e.g., height, shape, location, etc.) of the structures 2404 may be non-randomized or randomized (e.g., via a computerized randomization process, etc.). Randomizing height of the structures 2404 along the outside of the device component 2400 may help to reduce or avoid cavity resonance underneath the device housing in which the device component 2400 is housing. Exemplary embodiments may include rectangular pyramidal structures having the same size base but one or more of the rectangular pyramidal structures may have a different height than one or more other rectangular pyramidal structures.

Structures having different heights may be used to accommodate for variances in the height of shorter and taller adjacent components. For example, taller and shorter structures may be located relative to the device component 2400 so that the taller and shorter structures 2404 are aligned with shorter and taller components, respectively, when the device component 2400 is installed within an electronic device. The different heights of the structures may help to avoid or reduce cavity resonance within the device housing in which the device component 2400 is housed.

The pyramidal structures may include air-filled particles (e.g., air-filled microballoons, air-filled microbubbles, air-filled microspheres, etc.) for controllably decreasing dielectric constant of the pyramidal structures. The air-filled particles add air to the pyramidal structures, which decreases the dielectric constant (e.g., approximates foam, approaches foam properties, etc.).

FIG. 25 illustrates a pyramidal structure 2504 for an EMI absorber (e.g., EMI absorber 2404, etc.) according to exemplary embodiment embodying one or more aspects of the present disclosure. By way of example only, the pyramidal structure 204 may have the following parameters e.g., a flat base that is about 2.5 millimeters (mm) thick, a wedge thickness of about 2 mm, a wedge or pyramid height of about 3 mm, a truncated tip of the pyramid that is about 0.5 mm, a value height of 0.5 mm, and permittivity of 11-j3.3. In this example, the pyramid height is 3 mm, but the base of the pyramid 2504 is inside the flat base at a distance below the top of "valleyheight" which is 0.5 mm. This was done for controlling the "valley" during modelling. A value of 0 for the "valleyheight" would make the pyramid base at the same position of the flat base top. The tip of the pyramid is truncated by a value equal to "trunc" (0.5 mm). For a 0 value for "trunc", the pyramid would come to a point at the "wedgeheight" value (3 mm). Although better electromagnetic performance may be obtained if "trunc" and "valleyheight" are zero making sharp pyramids and sharp valleys, non-zero values for the "trunc" and "valleyheight" may be based on manufacturing capabilities.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. For example, when permissive phrases, such as "may comprise", "may include", and the like, are used herein, at least one embodiment comprises or includes the feature(s). As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances. Or for example, the term "about" as used herein when modifying a quantity of an ingredient or reactant of the invention or employed refers to variation in the numerical quantity that can happen through typical measuring and handling procedures used, for example, when making concentrates or solutions in the real world through inadvertent error in these procedures; through differences in the manufacture, source, or purity of the ingredients employed to make the compositions or carry out the methods; and the like. The term "about" also encompasses amounts that differ due to different equilibrium conditions for a composition resulting from a particular initial mixture. Whether or not modified by the term "about", equivalents to the quantities are included.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An electromagnetic interference (EMI) mitigation material comprising a filled dielectric including a pattern of EMI absorbers, wherein:

the EMI mitigation material includes a planarization layer having an inverted pattern of the pattern of EMI absorbers that interleaves with the pattern of EMI absorbers such that the planarization layer defines a planar surface over the pattern of EMI absorbers; and/or the pattern of EMI absorbers comprises a pattern of EMI absorbing pyramidal structures protruding outwardly along at least one side of the filled dielectric, the EMI absorbing pyramidal structures including bases configured such that the bases of adjacent EMI absorbing pyramidal structures contact each other or are adjacent without substantial gaps or spaced distances between the bases of adjacent EMI absorbing pyramidal structures.

2. The EMI mitigation material of claim 1, wherein the filled dielectric comprises one or more of:

single-walled carbon nanotubes;

multi-walled carbon nanotubes; and/or carbon nanostructures comprising a branched network of crosslinked carbon nanotube structures.

3. The EMI mitigation material of claim 1, wherein the filled dielectric comprises an injection moldable resin, including one or more of:

single-walled carbon nanotubes within the injection moldable resin;

multi-walled carbon nanotubes within the injection moldable resin; and/or carbon nanostructures comprising a branched network of crosslinked carbon nanotube structures within the injection moldable resin.

4. The EMI mitigation material of claim 1, wherein the filled dielectric comprises a polymer resin, including one or more of:

single-walled carbon nanotubes within the polymer resin;

multi-walled carbon nanotubes within the polymer resin; and/or carbon nanostructures comprising a branched network of crosslinked carbon nanotube structures within the polymer resin.

5. An EMI mitigation material of claim 1, wherein the EMI mitigation material is configured to be operable with greater than 15 decibels of reflection loss at frequencies from about 60 GHz to about 90 GHz.

6. The EMI mitigation material of claim 1, wherein:

the planarization layer comprises a graded dielectric material for impedance matching and/or the planarization layer includes microspheres for reducing overall dielectric constant whereby the planarization layer comprises a low dielectric loss, low dielectric constant material;

the EMI absorbing pyramidal structures have a height of 2 millimeter or less; and the planarization layer is configured to inhibit the ingress of dirt and other foreign object debris between adjacent EMI absorbing pyramidal structures, to help reinforce the EMI absorbing pyramidal structures, and to protect against breakage of the EMI absorbing pyramidal structures.

7. The EMI mitigation material of claim 1, wherein the pattern of EMI absorbing pyramidal structures comprises rectangular pyramids protruding outwardly along at least one side of the filled dielectric, the rectangular pyramids including rectangular bases configured such that the rectangular bases of adjacent rectangular pyramids contact each other or are adjacent without substantial gaps or spaced distances between the rectangular bases of the adjacent rectangular pyramids at which reflectivity might otherwise occur.

8. The EMI mitigation material of claim 1, wherein the filled dielectric comprises a multilayer film structure defined by a plurality of layers including:

fillers dispersed within the layers to define through-thickness domains and/or segregated discrete areas within the layers that define the pattern of EMI absorbers; and/or different filler densities and/or concentrations that define the pattern of EMI absorbers.

9. The EMI mitigation material of claim 1, wherein:

the EMI mitigation material includes at least a portion having a thermal conductivity within a range from about 1 W/m to 6 W/mK whereby the EMI mitigation material is configured to be multifunctional having a first functionality of EMI mitigation and a second functionality of thermal management; and the EMI mitigation material is configured to be sufficiently flexible and conformal to be wrapped about at least a portion of a component.

10. An EMI absorbing sheet comprising the EMI mitigation material of claim 1, wherein the pattern of EMI absorbing pyramidal structures protrude outwardly along at least one side of the EMI absorbing sheet.

11. The EMI absorbing sheet of claim 10, further comprising an adhesive backing along at least one side of the EMI absorbing sheet opposite the at least one side along which the EMI absorbing pyramidal structures outwardly protrude for adhesively mounting the EMI absorbing sheet to a surface such that the pattern of EMI absorbers reduce or avoid reflection of EMI incident on the pattern of EMI absorbers.

12. An EMI absorbing radar bracket comprising the EMI mitigation material of claim 1, wherein the EMI absorbing radar bracket is configured to be positionable relative to a radar device whereat reflection loss modifies radiation surrounding the radar device.

13. The EMI absorbing radar bracket of claim 12, wherein the EMI absorbing radar bracket is configured to absorb incident signals thereby limiting reflections, noise, false positives, and false negatives in signal readings.

14. The EMI mitigation material of claim 1, wherein the pattern of EMI absorbers is configured to suppress or reduce a probability of reflection of incident radiation through an aperture into a cavity or chamber when the pattern of EMI absorbers is disposed along an exterior to and/or an outside of the cavity or chamber.

15. The EMI mitigation material of claim 1, wherein:

the pattern of EMI absorbing pyramidal structures comprises rectangular pyramids protruding outwardly along at least one side of the filled dielectric, the rectangular pyramids including rectangular bases configured such that the rectangular bases of adjacent rectangular pyramids contact each other or are adjacent without substantial gaps or spaced distances between the rectangular bases of the adjacent rectangular pyramids at which reflectivity might otherwise occur; and a low dielectric loss, low dielectric constant material defines a planarization layer having an inverted pattern of the rectangular pyramids that interleaves with the rectangular pyramids such that the planarization layer defines a planar surface over the rectangular pyramids.

16. The EMI mitigation material of claim 1, wherein the filled dielectric comprises carbon nanotubes.

17. The EMI mitigation material of claim 1, wherein a low dielectric loss, low dielectric constant material is disposed over the pattern of EMI absorbers that defines the planarization layer having the inverted pattern of the EMI absorbers that interleaves with the EMI absorbers such that the planarization layer defines the planar surface over the EMI absorbers.

18. The EMI mitigation material of claim 1, wherein:

the planarization layer comprises one or more of a graded dielectric material for impedance matching, a thermally-conductive material, and an electrically-conductive material; and/or the planarization layer is configured to inhibit the ingress of dirt and other foreign object debris between adjacent pyramidal structures of the pattern of pyramidal structures; and/or the planarization layer includes microspheres for reducing overall dielectric constant; and/or a plurality of frequency selective surface (FSS) elements are disposed along the planarization layer.

19. The EMI mitigation material of claim 1, wherein the pattern of EMI absorbers are configured to reduce reflected radio frequency (RF) signals regardless of angle of incidence.

20. The EMI mitigation material of claim 1, wherein the pattern of EMI absorbing pyramidal structures are configured to have a gradual impedance change to incoming waves without a major reflection plane and to address multiple angles of incidence.

21. An electromagnetic interference (EMI) mitigation material comprising a filled dielectric including a pattern of EMI absorbers, wherein:

the EMI mitigation material includes a planarization layer having an inverted pattern of the pattern of EMI absorbers that interleaves with the pattern of EMI absorbers such that the planarization layer defines a planar surface over the pattern of EMI absorbers; and/or the pattern of EMI absorbers comprises a pattern of EMI absorbing pyramidal structures protruding outwardly along at least one side of the filled dielectric, the EMI absorbing pyramidal structures configured without substantial gaps or spaced distances between bases of adjacent EMI absorbing pyramidal structures at which reflectivity might otherwise occur.

22. The EMI mitigation material of claim 21, wherein the EMI absorbing pyramidal structures are configured such that the bases of adjacent EMI absorbing pyramidal structures contact each other.

23. An EMI absorbing radar bracket comprising the EMI mitigation material of claim 21, wherein:

the EMI absorbing radar bracket is configured to be positionable relative to a radar device whereat reflection loss modifies radiation surrounding the radar device; and the EMI absorbing radar bracket is configured to absorb incident signals thereby limiting reflections, noise, false positives, and false negatives in signal readings.

24. The EMI mitigation material of claim 21, wherein:

the filled dielectric comprises carbon nanotubes; and/or a low dielectric loss, low dielectric constant material is disposed over the pattern of EMI absorbers that defines the planarization layer having the inverted pattern of the EMI absorbers that interleaves with the EMI absorbers such that the planarization layer defines the planar surface over the EMI absorbers.

25. An electromagnetic interference (EMI) mitigation material comprising a filled dielectric including a pattern of EMI absorbers, wherein:

the EMI mitigation material includes a planarization layer having an inverted pattern of the pattern of EMI absorbers that interleaves with the pattern of EMI absorbers such that the planarization layer defines a planar surface over the pattern of EMI absorbers; and/or the pattern of EMI absorbers comprises a pattern of EMI absorbing pyramidal structures protruding outwardly along at least one side of the filled dielectric, the EMI absorbing pyramidal structures configured such that bases of adjacent EMI absorbing pyramidal structures are sufficiently adjacent to avoid reflectivity that might otherwise occur at substantial gaps or spaced distances between the bases of adjacent EMI absorbing pyramidal structures.

26. The EMI mitigation material of claim 25, wherein the EMI absorbing pyramidal structures are configured such that the bases of adjacent EMI absorbing pyramidal structures contact each other.

27. An EMI absorbing radar bracket comprising the EMI mitigation material of claim 25, wherein:

the EMI absorbing radar bracket is configured to be positionable relative to a radar device whereat reflection loss modifies radiation surrounding the radar device; and the EMI absorbing radar bracket is configured to absorb incident signals thereby limiting reflections, noise, false positives, and false negatives in signal readings.

28. The EMI mitigation material of claim 25, wherein:

the filled dielectric comprises carbon nanotubes; and/or a low dielectric loss, low dielectric constant material is disposed over the pattern of EMI absorbers that defines the planarization layer having the inverted pattern of the EMI absorbers that interleaves with the EMI absorbers such that the planarization layer defines the planar surface over the EMI absorbers.

* * * * *